United States Patent
Nagano et al.

(10) Patent No.: US 7,830,945 B2
(45) Date of Patent: *Nov. 9, 2010

(54) LASER APPARATUS IN WHICH LASER DIODES AND CORRESPONDING COLLIMATOR LENSES ARE FIXED TO BLOCK, AND FIBER MODULE IN WHICH LASER APPARATUS IS COUPLED TO OPTICAL FIBER

(75) Inventors: Kazuhiko Nagano, Kanagawa-ken (JP); Yoji Okazaki, Kanagawa-ken (JP); Teruhiko Kuramachi, Kanagawa-ken (JP); Takashi Yoshida, Kanagawa-ken (JP); Satoshi Mino, Kanagawa-ken (JP); Eiji Suzuki, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 834 days.

This patent is subject to a terminal disclaimer.

(21) Appl. No.: 10/616,227

(22) Filed: Jul. 10, 2003

(65) Prior Publication Data

US 2004/0027631 A1 Feb. 12, 2004

(30) Foreign Application Priority Data

Jul. 10, 2002 (JP) .............................. 2002-201902
Jul. 10, 2002 (JP) .............................. 2002-201905
Jul. 10, 2002 (JP) .............................. 2002-201906

(51) Int. Cl.
*H01S 3/08* (2006.01)

(52) U.S. Cl. ........................... 372/101; 372/34; 372/36; 372/107

(58) Field of Classification Search ................. 372/101, 372/107, 34, 36

See application file for complete search history.

(56) References Cited

U.S. PATENT DOCUMENTS 5,212,707 A * 5/1993 Heidel et al. ............. 372/50.23

(Continued)

FOREIGN PATENT DOCUMENTS

JP 3 018806 A 1/1991

(Continued)

OTHER PUBLICATIONS

Shunji Nakamura, et al./InGaN-Based Laser Diodes grown on GaN Substrates with a Fundamental Transverse Mode/Japanese Journal of Applied Physics Part 2 Letters, vol. 37, 1998, pp. L1020-1022.

*Primary Examiner*—Minsun Harvey
*Assistant Examiner*—Tod T Van Roy
(74) *Attorney, Agent, or Firm*—Sughrue Mion, PLLC

(57) ABSTRACT

A laser apparatus includes: a plurality of laser diodes respectively having light-emission points and being fixed to a block so that the light-emission points are aligned along a direction; and a collimator-lens array integrally formed to contain a plurality of collimator lenses which are arranged along a direction and respectively collimate laser beams emitted from the plurality of laser diodes. The block has a lens-setting surface which is flat, perpendicular to optical axes of the plurality of laser diodes, and located on the forward side of the plurality of laser diodes at a predetermined distance from the light-emission points, and the collimator-lens array is fixed to the block so that an end surface of the collimator-lens array is in contact with the lens-setting surface.

9 Claims, 24 Drawing Sheets

U.S. PATENT DOCUMENTS

| | | | |
|---|---|---|---|
| 5,432,535 A * | 7/1995 | Andrews et al. | 347/242 |
| 5,500,869 A | 3/1996 | Yoshida et al. | |
| 5,640,188 A * | 6/1997 | Andrews | 347/130 |
| 5,668,825 A | 9/1997 | Karpinski | |
| 5,790,576 A * | 8/1998 | Waarts et al. | 372/50.23 |
| 5,793,792 A | 8/1998 | Baxter et al. | |
| 5,870,133 A | 2/1999 | Naiki | |
| 6,271,049 B1 | 8/2001 | Auracher et al. | |
| 6,633,599 B2 * | 10/2003 | Murray et al. | 372/75 |
| 6,724,791 B1 * | 4/2004 | Chiappetta et al. | 372/36 |
| 2002/0018499 A1 * | 2/2002 | Kuniyasu et al. | 372/36 |
| 2002/0090172 A1 | 7/2002 | Okazaki et al. | |
| 2003/0048819 A1 | 3/2003 | Nagano et al. | |

FOREIGN PATENT DOCUMENTS

| | | |
|---|---|---|
| JP | 3 126070 A | 12/1991 |
| JP | 6 196816 A | 7/1994 |
| JP | 6-334262 | 12/1994 |
| JP | 09-015472 A | 1/1997 |
| JP | 09-178987 A | 7/1997 |
| JP | 09-295355 A | 11/1997 |
| JP | 11-014869 A | 1/1999 |
| JP | 2000-091688 A | 3/2000 |
| JP | 2002 026452 A | 1/2002 |
| JP | 2002-158389 A | 5/2002 |
| WO | 00/59086 A1 | 10/2000 |

* cited by examiner

LASER APPARATUS IN WHICH LASER DIODES AND CORRESPONDING COLLIMATOR LENSES ARE FIXED TO BLOCK, AND FIBER MODULE IN WHICH LASER APPARATUS IS COUPLED TO OPTICAL FIBER

BACKGROUND OF THE INVENTION

1. Field of the Invention

The present invention relates to a laser apparatus in which a plurality of laser diodes are fixedly arranged on a block, and a laser apparatus in which laser beams emitted from a plurality of laser diodes are collimated into a plurality of collimated laser beams which are parallel to each other.

The present invention also relates to a method for producing a laser apparatus in which laser beams emitted from a plurality of laser diodes are collimated into a plurality of collimated laser beams which are parallel to each other.

The present invention further relates to a fiber module comprising a light source and an optical fiber which light emitted from the light source enter.

2. Description of the Related Art

Conventionally, in order to generate a laser beam having a ultraviolet wavelength, wavelength conversion lasers, excimer lasers, and Ar lasers are used. In the wavelength conversion lasers, infrared light emitted from a solid-state laser excited with a semiconductor laser is converted into a third harmonic having an ultraviolet wavelength.

Further, recently, GaN-based compound semiconductor lasers (laser diodes) which emit a laser beam having a wavelength in the vicinity of 400 nm have been provided, for example, as disclosed in Japanese Journal of Applied Physics Part 2 Letters, vol. 37, 1998, pp. L1020.

Light sources which emit laser beams having the wavelengths as mentioned above are considered to be used in exposure systems for exposure of photosensitive materials which are sensitive to light in a predetermined wavelength range including an ultraviolet wavelength range of 350 to 420 nm. In such a case, the light sources for exposure are required to have sufficient output power for exposing the photosensitive materials. The above predetermined wavelength range is hereinafter referred to as the ultraviolet range.

However, the excimer lasers are large in size, and the manufacturing costs and maintenance costs of the excimer lasers are high.

In the wavelength conversion lasers which convert infrared light into a third harmonic in the ultraviolet range, the wavelength conversion efficiency is very low. Therefore, it is very difficult to achieve high output power. In a typical wavelength conversion laser at the currently practical level, a solid-state laser medium is excited with a semiconductor laser having an output power of 30 W so as to output a fundamental harmonic having a wavelength of 1,064 nm and an output power of 10 W, the fundamental harmonic is converted into a second harmonic having a wavelength of 532 nm and an output power of 3 W, and a third harmonic having a wavelength of 355 nm (i.e., a sum frequency of the first and second harmonics) and an output power of 1 W is obtained. In this wavelength conversion laser, the efficiency in electric-to-optical conversion in the semiconductor laser is about 50%, and the efficiency in conversion to the ultraviolet light is as low as about 1.7%. In addition, since an optical wavelength conversion element is used in the above wavelength conversion laser, and the optical wavelength conversion element is expensive, the manufacturing cost of the wavelength conversion laser is high.

Further, the efficiency in electric-to-optical conversion in the Ar lasers is as low as 0.005%, and the lifetime thereof is as short as about 1,000 hours.

On the other hand, since it is difficult to obtain a low-dislocation GaN crystal substrate, an attempt has been made to achieve high output power and reliability in a GaN-based compound semiconductor laser. In the attempt, a low-dislocation region having a width of about 5 micrometers is produced by a growth method called ELOG (epitaxial lateral overgrowth), and a laser region is formed on the low-dislocation region. However, even in the attempt, it is difficult to obtain a low-dislocation substrate having a large area. Therefore, no GaN-based compound semiconductor laser having a high output power of 500 mW to 1 W has yet been commercialized.

In another attempt to increase output power of a semiconductor laser, for example, it has been considered to form a hundred cavities each of which outputs light with 100 mW so as to obtain a total output power of 10 W. However, it is almost unrealistic to manufacture as many as 100 cavities with high yield. In particular, it is difficult to manufacture GaN-based compound semiconductor lasers each having many cavities since manufacture of GaN-based compound semiconductor lasers with a high yield of 99% or greater is difficult even when the GaN-based compound semiconductor lasers each have a single cavity.

In view of the above circumstances, the present inventors have proposed laser apparatuses having particularly high output power (which are also referred to as optically-multiplexing laser-light sources), as disclosed in U.S. Patent Applications 20020090172 A1 and 20030048819 A1 (respectively corresponding to Japanese Unexamined Patent Applications Nos. 2001-273849 and 2001-273870).

A laser apparatus disclosed in U.S. Patent Application 20020090172 A1 is constituted by a plurality of laser diodes, a single multimode optical fiber, and an optical condensing system which collects laser beams emitted from the plurality of laser diodes, and couples the collected laser beams to the multimode optical fiber. This laser apparatus can be manufactured at low cost. In a preferred embodiment of the laser apparatus, the plurality of laser diodes are arranged so that light-emission points of the laser diodes are aligned along a certain direction.

On the other hand, in a laser apparatus disclosed in U.S. Patent Application 20030048819 A1, a plurality of multicavity laser-diode chips each having a plurality of light-emission points are fixedly arranged.

When a plurality of laser diodes are arranged so that the light-emission points are aligned along a certain direction, normally, the plurality of laser diodes are fixed to a block such as a heat dissipation block made of copper or copper alloy.

The above laser apparatuses have the following problems (1) to (3).

(1) Since the laser beams emitted from each laser diode are divergent, it is necessary to collimate the divergent laser beams through collimator lenses, and make the laser beams converge on a point. At this time, the collimator lenses may be separately arranged, or integrally formed into a collimator-lens array in which collimator-lens portions are arranged along a line. In either case, it is necessary to accurately position the laser diodes and the collimator lenses or the collimator-lens array so that the optical axes of the collimator lenses (or the collimator-lens portions) respectively coincide with the light-emission axes of the laser diodes. When the above positioning is inaccurately performed, it is impossible to make the plurality of laser beams converge on a small spot. Therefore, for example, when a photosensitive material is exposed to the laser beams in order to form an image, it becomes impossible to form a fine image by the exposure.

(2) In order to make divergent laser beams emitted from a plurality of laser diodes converge on a point, it is necessary to collimate the divergent laser beams through collimator lenses, and make the collimated laser beams propagate parallel to each other and enter a condensing lens. In order to realize this operation, the laser diodes and the collimator lenses are required to be accurately positioned so that the focal points of the collimator lenses coincide with the light-emission points of the laser diodes, and the lines each passing through one of the light-emission points and a center of a corresponding one of the collimator lenses are parallel to each other. If the laser diodes and the collimator lenses are inaccurately positioned, it becomes impossible to make the plurality of laser beams converge on a sufficiently small spot.

In order to prevent occurrence of the above problem, it is necessary to position the collimator lenses and the laser diodes with a small pitch and micron to submicron alignment precision in the X, Y, and Z directions. When the pitch is small, the gaps between the collimator lenses become small, for example, as small as 100 micrometers or less. Although a method for adjusting the position of each lens during activation of the laser diodes is known, it is not easy to adjust the position of each lens by moving the lens in the X, Y, and Z directions relative to a corresponding laser diode, since there is no sufficient space for equipment which securely holds the lenses.

For example, in order to adjust the three-axis alignment, it is necessary to fix each collimator lens to a laser block through a holder element. Therefore, fixation at least two places is required for each collimator lens. Therefore, when seven laser diodes are used for optical multiplex, bonding is required to be performed at fourteen places with micron to submicron alignment precision in the X, Y, and Z directions. At this time, the total yield is proportional to the fourteenth power of the fixation yield at each place of fixation. Therefore, even in the case where the reliability of fixation at each place of fixation is increased, it is very difficult to achieve a satisfactory yield when the number of places of fixation increases.

In addition, it is important to make bonding surfaces of the holder element, the lenses, and the laser diode block parallel to each other. However, due to inaccuracy of the individual parts, the parallelism between the holder element, the lenses, and the laser diode block is not necessarily compatible with the alignment between optical axes of the lenses and the laser diodes, and therefore it is difficult to ensure precision. Thus, the alignment yield decreases, alignment time and parts cost increase, and the total cost of the laser apparatus also increases.

(3) In many optically-multiplexing laser-light sources using a multimode optical fiber, a plurality of laser diodes, an optical condensing system, and an end portion of the optical fiber are contained in a package so as to form a fiber module. In such a fiber module, the end portion of the optical fiber is fixed to a fiber holder, a bracket, or the like which is internally fixed to the package. Conventionally, the optical fiber is fixed by YAG welding or brazing of a ferruled optical fiber.

However, the precision of the fixation of the optical fiber by the YAG welding is plus/minus 1 to plus/minus 5 micrometers, and the precision of the fixation with the brazing material is plus/minus 5 to plus/minus several tens of micrometers. Therefore, it is impossible to accurately arrange the optical fiber so as to align the optical fiber with a position at which the laser beams converge. Actually, the coupling efficiency of the laser beams to the optical fiber is about 80% in the case of YAG welding, and about 60 to 80% in the case of brazing. Further, an attempt to bond the optical fiber with an adhesive has been made. However, the precision of the conventional fixation of the optical fiber with an adhesive is similar to those in the cases of the YAG welding or brazing.

SUMMARY OF THE INVENTION

The present invention has been developed in view of the above circumstances.

A first object of the present invention is to provide a laser apparatus in which a plurality of laser diodes are arranged so that light-emission points are aligned along a direction, and collimator lenses are accurately positioned so that the optical axes of the collimator lenses coincide with light-emission axes of the plurality of laser diodes.

A second object of the present invention is to provide a method for producing a laser apparatus in which a plurality of laser diodes are arranged so that light-emission points are aligned along a direction, the focal points of collimator lenses coincide with the light-emission points of the laser diodes, and the lines each passing through one of the light-emission points and a center of a corresponding one of the collimator lenses are parallel to each other.

A third object of the present invention is to provide a laser apparatus in which a plurality of laser diodes and a plurality of collimator lenses are accurately positioned so that light-emission points of the laser diodes are aligned along a direction, the focal points of the collimator lenses coincide with the light-emission points of the laser diodes, and the lines each passing through one of the light-emission points and a center of a corresponding one of the collimator lenses are parallel to each other.

A fourth object of the present invention is to provide a fiber module which can couple incident light to an optical fiber with high coupling efficiency.

(I) In order to accomplish the first object, the first aspect of the present invention is provided. According to the first aspect of the present invention, there is provided a laser apparatus comprising: a block; a plurality of laser diodes respectively having light-emission points and being fixed to the block so that the light-emission points are aligned along a direction; and a collimator-lens array integrally formed to contain a plurality of collimator lenses which are arranged along a direction and respectively collimate laser beams emitted from the plurality of laser diodes. The block has a lens-setting surface which is flat, perpendicular to optical axes of the plurality of laser diodes, and located on the forward side (i.e., the side toward which the laser beams are emitted) of the plurality of laser diodes at a predetermined distance from the light-emission points, and the collimator-lens array is fixed to the block so that an end surface of the collimator-lens array is in contact with the lens-setting surface.

That is, the collimator-lens array is fixed to the block so that an end surface of the collimator-lens array is in contact with the lens-setting surface in the construction of the laser apparatus according to the first aspect of the present invention. Therefore, in assembly of the laser apparatus according to the first aspect of the present invention, it is possible to easily and correctly adjust the position of the collimator-lens array so that the optical axes of the collimator lenses respectively coincide with the light-emission axes of the laser diodes, by pressing the collimator-lens array against the lens-setting surface and moving the collimator-lens array within a plane perpendicular to the optical axes of the laser diodes.

When the collimator-lens array is fixed to the block while holding the collimator-lens array at the position adjusted as above, the above end surface of the collimator-lens array can be surely fixed to the lens-setting surface at the predetermined distance from the light-emission points of the laser diodes. Therefore, when the above distance is predetermined so that the focal points of the collimator lenses are located at the light-emission points of the laser diodes, the collimator lenses can be appropriately positioned in the direction of the optical axes of the collimator lenses, i.e., the collimator lenses are positioned so that the laser beams (which are originally divergent) are accurately collimated.

Alternatively, in order to fix the collimator-lens array to the block, a surface of the collimator-lens array other than the above end surface may be bonded to the block. For example, a surface of the collimator-lens array which is parallel to the optical axes may be bonded to a lens-fixation surface which is formed in the block and parallel to the light-emission axes of the laser diodes.

Preferably, the laser apparatus according to the first aspect of the present invention may also have one or any possible combination of the following additional features (i) to (x).

(i) The lens-setting surface of the block has a flatness not greater than 0.5 micrometers. In this case, it is possible to suppress movement of the collimator-lens array and accurately position the collimator-lens array when the collimator-lens array is fixed to the block.

(ii) The block has a laser-fixation surface on which the plurality of laser diodes are fixed, and the laser-fixation surface has a flatness not greater than 0.5 micrometers. In this case, it is possible to suppress movement of the laser diodes and accurately position the laser diodes when the laser diodes are fixed to the block, for example, with brazing material.

(iii) The plurality of laser diodes are realized by a multi-cavity laser-diode chip having a plurality of light-emission points.

Since the multicavity laser-diode chip has a plurality of light-emission points, the multicavity laser-diode chip has high output power.

(iv) The plurality of laser diodes are realized by a plurality of multicavity laser-diode chips each having a plurality of light-emission points.

Since each multicavity laser-diode chip has high output power, particularly high output power is achieved when a plurality of multicavity laser-diode chips are used.

(v) The plurality of laser diodes are realized by a plurality of single-cavity laser-diode chips each having a single light-emission point.

(vi) Each of the plurality of laser diodes is mounted on the block in a junction-side-down structure. In the junction-side-down structure, the element-formation side (the pn-junction side), instead of the substrate side, is fixed to a heat dissipation mount having great thermoconductivity.

(vii) Each of the plurality of laser diodes is realized by a nitride-based compound laser-diode chip, the block is a heat-dissipation block made of copper or copper alloy, the laser apparatus further comprises a plurality of submounts which are made of a material having a thermal expansion coefficient of 3.5 to $6.0\times10^{-6}/°$ C., have a thickness of 200 to 400 micrometers, and are separately formed on the heat-dissipation block, each of the plurality of laser diodes and the plurality of submounts has a bonding surface, and each of the plurality of laser diodes is junction-side-down mounted on one of the plurality of submounts in such a manner that the bonding surface of each of the plurality of laser diodes is bonded to the bonding surface of one of the plurality of submounts through a metalization layer and an Au—Sn eutectic solder layer each of which is divided into a plurality of areas.

In this case, since the heat-dissipation block in the laser apparatus according to the first aspect of the present invention is made of one of copper and copper alloy, which are inexpensive and exhibit high heat conductivity, it is possible to effectively dissipate heat generated by the plurality of laser diodes, and produce the laser apparatus at low cost.

In addition, since each laser diode is fixed on a submount in a junction-side-down structure, the light emission region of the laser diode is located nearer to the submount and the heat-dissipation block, and therefore heat is dissipated more effectively, in comparison with the case where the substrate-side of the laser diode is bonded to the submount.

Further, since the laser-diode chips are bonded to the submounts with the Au—Sn eutectic solder, and the Au—Sn eutectic solder is superior in characteristics relating to locational variations with elapse of time, the variations of the locations of the light-emission points with elapse of time can be effectively suppressed in the laser apparatus according to the first aspect of the present invention.

Furthermore, since the submounts are made of a material having a thermal expansion coefficient of 3.5 to $6.0\times10^{-6}/°$ C., and have a thickness of 200 to 400 micrometers, it is possible to prevent deterioration of the laser diodes which can be caused by thermal strain generated by solder bonding, for the reason to be explained later in relation to an embodiment of the present invention.

Moreover, since the Au—Sn eutectic solder layer between the bonding surfaces of each submount and a corresponding laser diode is divided into a plurality of areas, it is possible to limit stress occurring around the bonded areas, to a small amount.

(viii) In the laser apparatus having the feature (vii), each of the plurality of laser diodes contains a light emission region, and the metalization layer and the Au—Sn eutectic solder layer are separated by a groove which is arranged immediately below the light emission region.

(ix) In the laser apparatus having the feature (vii), the plurality of submounts are made of AlN.

(x) In the laser apparatus having the feature (vii), the plurality of submounts are bonded to the heat-dissipation block with Au—Sn eutectic solder.

(II) Further, in order to accomplish the first object, the second aspect of the present invention is provided. According to the second aspect of the present invention, there is provided a laser apparatus comprising: a plurality of blocks stacked in a plurality of layers; a plurality of laser diodes respectively having light-emission points and being fixed to the plurality of blocks so that the light-emission points are aligned in the plurality of layers in each of which more than one of the light-emission points are aligned along a predetermined direction; and a plurality of collimator-lens arrays arranged in correspondence with the plurality of layers, each of the plurality of collimator-lens arrays is integrally formed to contain a plurality of collimator lenses which are arranged along the predetermined direction, and the plurality of collimator lenses in the plurality of collimator-lens arrays respectively collimate laser beams emitted from the plurality of laser diodes. The plurality of blocks respectively have lens-setting surfaces, the lens-setting surfaces are flat, perpendicular to optical axes of the plurality of laser diodes, and located on the forward side of the plurality of laser diodes at a predetermined distance from the light-emission points, and the plurality of collimator-lens arrays are fixed to the plurality of blocks so that end surfaces of the plurality of collimator-lens arrays are respectively in contact with the lens-setting surfaces.

In this case, a greater number of laser diodes can be arranged with higher density so as to obtain higher output power in comparison with the laser apparatus according to the first aspect of the present invention.

(III) In order to accomplish the second object, the third aspect of the present invention is provided. According to the third aspect of the present invention, there is provided a method for producing a laser apparatus including a block, a plurality of laser diodes respectively having light-emission points and being fixed to the block so that the light-emission points are aligned along a direction, and a collimator-lens array integrally formed to contain a plurality of collimator lenses which are arranged along a direction and respectively collimate laser beams emitted from the plurality of laser diodes. The method comprises the steps of (a) forming in the block a reference surface which is flat, perpendicular to optical axes of the plurality of laser diodes, and located on a forward side of locations at which the plurality of laser diodes are fixed to the block; (b) adjusting a position of each of the plurality of laser diodes in a direction parallel to the optical axes based on information obtained by measurement of a focal length of one of the plurality of collimator lenses corresponding to the laser diode, and fixing the laser diode at the adjusted position; and (c) adjusting positions of the plurality of collimator lenses along the reference surface, and fixing the plurality of collimator lenses at the adjusted positions.

In the method according to the third aspect of the present invention, a reference surface is formed in the block in step (a), and the reference surface is flat, perpendicular to optical axes of the plurality of laser diodes, and located on the forward side of the locations at which the plurality of laser diodes are fixed to the block. Then, in step (b), the position of each of the plurality of laser diodes in the direction parallel to the optical axes is adjusted based on information obtained by measurement of the focal length of one of the plurality of collimator lenses corresponding to the laser diode, and the laser diode is then fixed at the adjusted position. Therefore, the plurality of laser diodes can be positioned on the block so that the light-emission points of the laser diodes are accurately located at the focal points of the plurality of collimator lenses, respectively. Thereafter, the positions of the plurality of collimator lenses are adjusted along the reference surface, and are then fixed to the reference surface. Thus, it is possible to realize the situation in which lines each passing through one of the light-emission points and a center of a corresponding one of the collimator lenses are parallel to each other.

When the above method is used, it is possible to produce a laser apparatus according to the fourth aspect of the present invention, in which laser beams emitted from a plurality of laser diodes are accurately collimated, and the collimated laser beams are aligned parallel to each other. When the laser apparatus according to the fourth aspect of the present invention is used in combination with a condensing lens, it is possible to make the plurality of laser beams converge in a sufficiently small spot diameter.

As explained before, in the conventional lens adjustment, the number of places at which the laser diodes and the collimator lenses are fixed is twice the number of laser beams which are optically multiplexed, and therefore it is difficult to ensure reliability. According to the third aspect of the present invention, the focusing operations are performed on the laser-diode side. Therefore, the number of fixed places are reduced in half (nearly equal to the number of laser beams which are optically multiplexed), and the alignment can be adjusted by simple equipment. Thus, it is expected that the laser apparatus can be assembled in a small number of man-hours with high reliability. Since the total yield is proportional to the nth power of the fixation yield at one place, and the exponent n is the number of places of fixation, it is very advantageous to reduce the number of places of fixation in half.

(IV) In order to accomplish the third object, the fourth aspect of the present invention is provided. According to the fourth aspect of the present invention, there is provided a laser apparatus comprising: a block; a plurality of laser diodes respectively having light-emission points and being fixed to the block so that the light-emission points are aligned along a direction; and a plurality of collimator lenses which are arranged along a direction and respectively collimate laser beams emitted from the plurality of laser diodes. The block has a reference surface which is flat, perpendicular to optical axes of the plurality of laser diodes, and located on a forward side of portions of the block to which the plurality of laser diodes are fixed, each of the plurality of laser diodes is fixed to the block in such a manner that a position of the laser diode in a direction parallel to the optical axes is adjusted based on a focal length of one of the plurality of collimator lenses corresponding to the laser diode, and the plurality of collimator lenses are fixed to the reference surface in such a manner that positions of the plurality of collimator lenses are adjusted along the reference surface.

Preferably, the laser apparatus according to the fourth aspect of the present invention may also have one or any possible combination of the following additional features (xi) and (xii).

(xi) The block is a heat-dissipation block, the plurality of laser diodes are junction-side-down mounted on a plurality of submounts, and the plurality of submounts are arranged on the block so that the light-emission points are aligned along a line.

(xii) Each of the plurality of laser diodes has a visible feature indicating a position of emission at a front end of the laser diode, and the plurality of laser diodes and the plurality of submounts are arranged so that the visible feature can be viewed from a submount side.

(V) In order to accomplish the fourth object, the fifth aspect of the present invention is provided. According to the fifth aspect of the present invention, there is provided a fiber module comprising: an optical fiber; a support member for supporting an end portion of the optical fiber; a light source; and an optical system which makes light emitted from the light source enter the optical fiber from an end face of the optical fiber. The optical fiber is bonded to the support member with a thin layer of an ultraviolet-light-curing type adhesive.

According to research by the present inventors, it has been found that a sufficient precision of fixation is not obtained by the conventional techniques in which optical fibers are fixed with an adhesive, YAG welding, or a brazing material, because thermal expansion or contraction occurs when temperature of the fixed places changes during manufacture or use of the fiber module.

In view of the above finding, according to the fifth aspect of the present invention, the optical fiber is bonded to the support member with a thin layer of an ultraviolet-light-curing type adhesive. Therefore, it is possible to limit thermal expansion or contraction caused by temperature change to a small amount, and achieve sufficient precision of fixation.

Preferably, the fiber module according to the fifth aspect of the present invention may also have one or any possible combination of the following additional features (xiii) to (xxiv).

(xiii) The thin layer of the ultraviolet-light-curing type adhesive has a thickness not greater than one micrometer. In this case, it is possible to make the coupling efficiency of incident light to the optical fiber 90% or greater.

(xiv) The support member is optically transparent. In this case, when the ultraviolet-light-curing type adhesive is cured by exposure to ultraviolet light, the transparent support member does not obstruct the ultraviolet light. Therefore, it is possible to arbitrarily set the direction of irradiation with the ultraviolet light, and achieve satisfactory workability.

(xv) The optical fiber is a multimode optical fiber, the light source is realized by a plurality of laser diodes, and the optical system is an optical condensing system which collects laser beams emitted from the light source, and couples the collected laser beams to the multimode optical fiber.

In this case, the fiber module according to the fifth aspect of the present invention constitutes an optically-multiplexing laser-light source, and the construction of the optically-multiplexing laser-light source becomes very simple. In addition, since no constituent which is difficult to produce is used in the optically-multiplexing laser-light source, the optically-multiplexing laser-light source can be produced at low cost.

(xvi) In the fiber module having the feature (xv), the plurality of laser diodes are arranged so that light-emission points of the plurality of laser diodes are aligned along a line parallel to active layers of the plurality of laser diodes, the optical condensing system comprises a plurality of collimator lenses and a condensing lens, the plurality of collimator lenses are respectively provided in correspondence with the plurality of laser diodes, collimate laser beams emitted from the plurality of laser diodes, and each have a first aperture diameter in a direction parallel to the line and a second aperture diameter in a direction perpendicular to the line and greater than the first aperture diameter, and the condensing lens collects the laser beams collimated by the plurality of collimator lenses, and makes the collimated laser beams converge on the end face of the optical fiber.

In this case, it is possible to reduce the pitch with which the plurality of laser diodes are arranged. That is, arrangement with higher density is enabled.

When the plurality of laser diodes are arranged with high density as above, the misalignment of the plurality of laser beams at an end face of the multimode optical fiber can be limited to a smaller amount. Therefore, it is possible to relax requirements for alignment precision in assembly of the plurality of laser diodes, the optical condensing system, and the multimode optical fiber. Further, since the alignment precision in the assembly can be relaxed as above, it is possible to increase the number of optically multiplexed laser beams and the output power for the reason to be explained later.

(xvii) In the fiber module having the feature (xvi) the plurality of collimator lenses are integrally formed into a lens array.

In this case, it is possible to prevent occurrence of wide noneffective space in the vicinities of the respective collimator lenses, although wide noneffective space occurs in the case where a plurality of collimator lenses are separately formed. Therefore, when the plurality of collimator lenses are integrally formed into a lens array, the plurality of collimator lenses can be arranged more closely, i.e., with higher density. Thus, the effect of relaxing the alignment precision in the assembly and the effect of increasing the number of optically multiplexed laser beams and output power are further enhanced.

In addition, the positions of the plurality of collimator lenses can be adjusted by only the adjustment of the single lens array. That is, the operation for the position adjustment is simplified.

(xviii) In the fiber module having the feature (xv), the plurality of laser diodes are mounted on a plurality of blocks which are joined (or bonded together).

In this case, it is possible to increase the mounting yield of the laser diodes in comparison with the case where all of the laser diodes are mounted on a single block. For example, in the case where the mounting yield of a single laser diode is 98%, the total mounting yield in the case where six laser diodes are mounted on a single block is 88% ($=0.98^6 \times 100$). On the other hand, the total mounting yield in the case where three laser diodes are mounted on each of two blocks becomes 94% ($=0.98^3 \times 100$) since almost 100% yield is realized in the step of joining the two blocks.

(xix) In the fiber module having the feature (xv), the plurality of laser diodes are arranged along a line, and the number of the plurality of laser diodes is three to ten, and more preferably six or seven.

According to the polarization multiplex, which is conventionally known, laser beams emitted from only two laser diodes can be optically multiplexed. On the other hand, when the number of the laser diodes arranged in the laser apparatus according to the first aspect of the present invention is three or greater, it is possible to obtain an optically multiplexed laser beam with higher output power than the optically multiplexed laser beams which are conventionally obtained. However, currently, the yield in the step of mounting a laser diode is about 98%. When the yield in the step of mounting a laser diode is 98%, the yield in the step of mounting ten laser diodes is as low as 82%. Practically, the yield lower than 82% is not preferable. Therefore, based on the current yield in the step of mounting a laser diode, the preferable upper limit of the number of the laser diodes arranged in the laser apparatus according to the first aspect of the present invention is determined to be ten.

In the case where the multimode optical fiber having a core diameter not greater than 50 micrometers and a numerical aperture not greater than 0.3 or the multimode optical fiber in which the core diameter multiplied by the numerical aperture is not greater than 7.5 micrometers is used for image formation, and ten laser diodes are arranged along a line, a mounting precision less than 0.1 micrometers is required. However, when the number of the laser diodes arranged along a line is limited to six or seven, the requirement for the mounting precision is remarkably relaxed and becomes 0.3 to 1.0 micrometers. In addition, the output power of the fiber module having six or seven laser diodes is twice or more the output power of the fiber module having three laser diodes.

(xx) In the fiber module having the feature (xv), each of the plurality of laser diodes has an emission width of 1.5 to 5 micrometers, and more preferably 2 to 3 micrometers.

For example, in the case of a GaN-based compound laser diode, when each of the plurality of laser diodes has an emission width of 1.5 micrometers or greater, the output power of each laser diode (50 mW or greater) is higher than the maximum output power (about 30 mW) in a completely single transverse mode. On the other hand, in the case where the multimode optical fiber having a core diameter not greater than 50 micrometers and a numerical aperture not greater than 0.3 or the multimode optical fiber in which the core diameter multiplied by the numerical aperture is not greater than 7.5 micrometers is used for image formation, and each of the plurality of laser diodes has an emission width of 5 micrometers or smaller, it is possible to construct an optical condensing and coupling system with three or more laser diodes. In particular, in the case where the above multimode optical fiber is used, and each of the plurality of laser diodes has an emission width of 2 to 3 micrometers, it is possible to construct an optical condensing and coupling system with six or seven laser diodes.

(xxi) In the fiber module having the feature (xv), each of the plurality of laser diodes is a GaN-based compound laser diode.

(xxii) In the fiber module having the feature (xv), the multimode optical fiber has a core diameter not greater than 50 micrometers and a numerical aperture not greater than 0.3.

In the fields of printing, medical imaging, formation of images for PCBs (printed circuit boards), PDPs (plasma display panels), LCDs (liquid crystal displays) in photosensitive materials by exposure, and the like, when the core diameter of the multimode optical fiber is not greater than 50 micrometers, it is possible to make the exposure spot very small and realize highly fine image exposure. In addition, when the numerical aperture of the multimode optical fiber is not greater than 0.3, it is possible to achieve a sufficient focal depth for the highly fine image exposure, i.e., to expose highly sharp images.

(xxiii) In the fiber module having the feature (xv), the multimode optical fiber has a core diameter and a numerical aperture, and the core diameter multiplied by the numerical aperture is not greater than 7.5 micrometers.

In the case where the core diameter multiplied by the numerical aperture is not greater than 7.5 micrometers, possible combinations of the core diameter and the numerical aperture are, for example, 50 μm×0.15, 40 μm×0.188, 30 μm×0.25, and 25 μm×0.3. When a multimode optical fiber in which the core diameter multiplied by the numerical aperture is not greater than 7.5 micrometers is used, the plurality of laser beams emitted from the plurality of laser diodes can be collimated by the plurality of collimator lenses having a numerical aperture equivalent to the numerical aperture of the multimode optical fiber, and the collimated laser beams can be collected in a spot not greater than 25 micrometers by the condensing lens having a numerical aperture of 0.3. Therefore, it is possible to achieve high resolution and a sufficient focal depth.

(xxiv) In the fiber module having the feature (xv), the plurality of laser diodes are fixed so that the plurality of laser diodes are two-dimensionally arranged when viewed from a laser-receiving side. This arrangement is especially preferable when an optically-multiplexing laser-light source is constituted by the fiber module according to the fifth aspect of the present invention.

In this case, a great number of laser diodes can be arranged with high density. Therefore, it is possible to make a great number of laser beams enter a single multimode optical fiber, and obtain an optically multiplexed laser beam with higher output power.

(VI) Further, in order to accomplish the fourth object, the sixth aspect of the present invention is provided. According to the sixth aspect of the present invention, there is provided a fiber module comprising a plurality of laser units each of which includes: a multimode optical fiber; a support member for supporting an end portion of the multimode optical fiber; a plurality of laser diodes; and an optical condensing system which collects laser beams emitted from the light source, and makes the collected laser beams enter the multimode optical fiber from an end face of the optical fiber. The multimode optical fiber is bonded to the support member with a thin layer of an ultraviolet-light-curing type adhesive.

In the fiber module the sixth aspect of the present invention, the multimode optical fibers in the plurality of laser units are arranged to constitute a one-dimensional array or a bundle at least at a light-emitting end of the multimode optical fiber.

In this case, a plurality of high-power laser beams aligned in a one-dimensional array or a bundle can be emitted from the multimode optical fibers. Therefore, it is possible to make each of the high-power, aligned laser beams enter one of modulation portions constituting a spatial light modulation element such as a GLV or DMD and being one or two-dimensionally arranged, and perform efficient modulation for image exposure or the like.

DESCRIPTION OF PREFERRED EMBODIMENTS

Embodiments of the present invention are explained in detail below with reference to drawings.

First Embodiment

Figure 1:
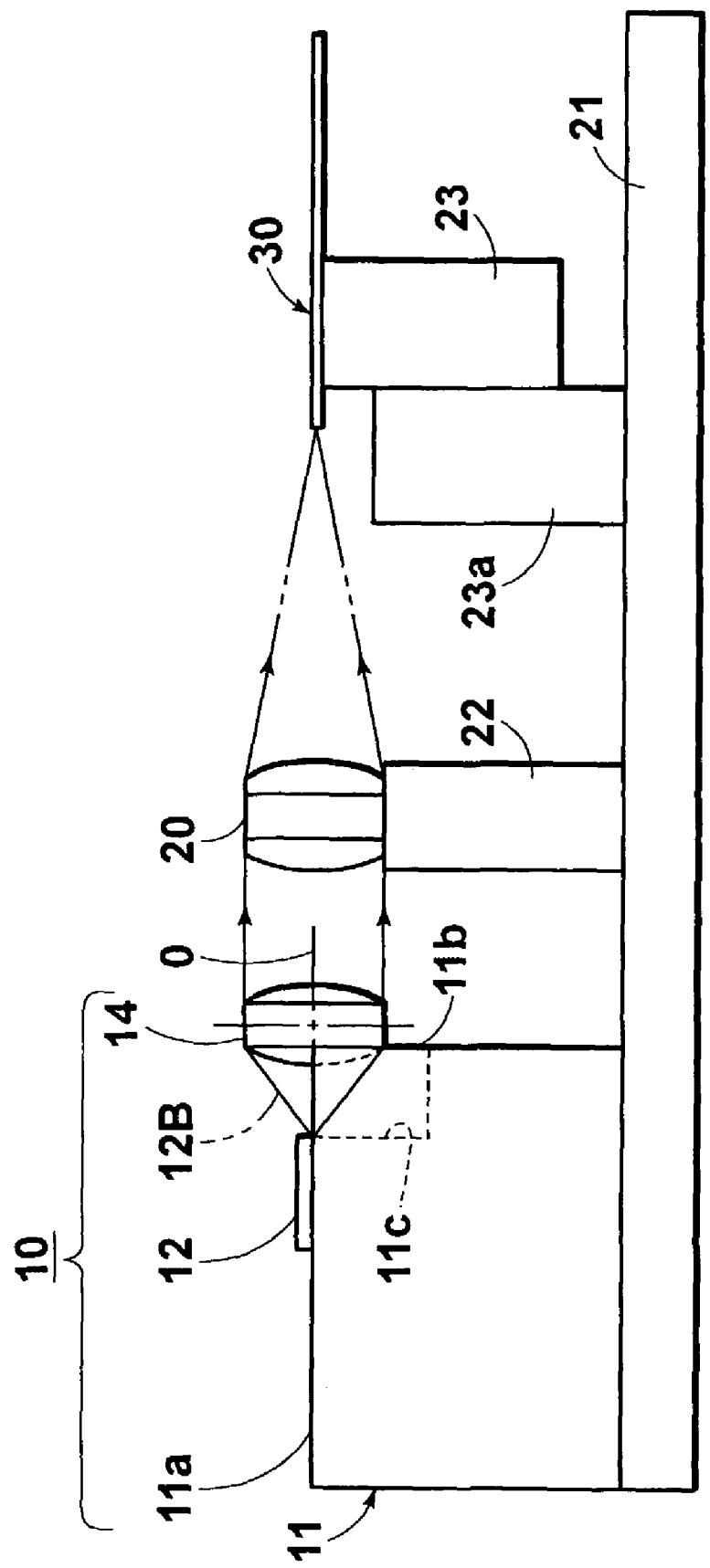
FIG. 1 is a side view of a fiber module using a laser apparatus according to a first embodiment of the present invention.
Figure 2:
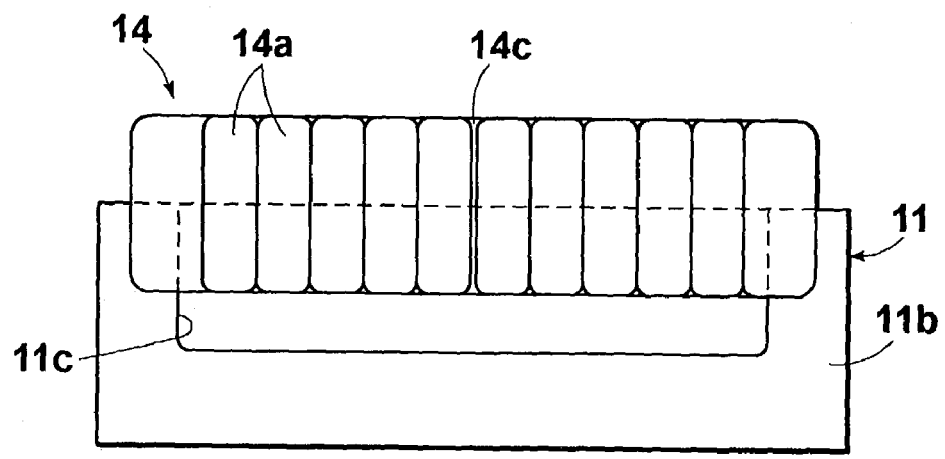
FIG. 2 is a front view of the laser apparatus used in the fiber module of FIG. 1.
Figure 3:
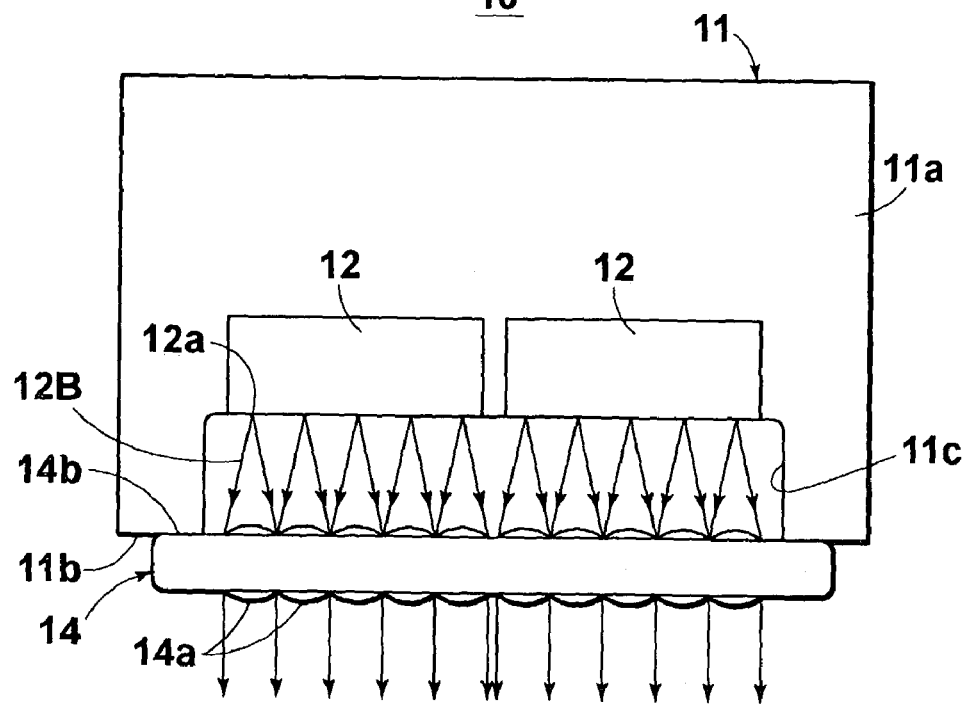
FIG. 3 is a plan view of the laser apparatus used in the fiber module of FIG. 1.

FIG. 1 is a side view of a fiber module using a laser apparatus according to the first embodiment of the present invention, and FIGS. 2 and 3 are front and plan views of the laser apparatus used in the fiber module of FIG. 1. The fiber module of FIG. 1 realizes an optically-multiplexing laser-light source. As illustrated in FIGS. 1, 2, and 3, the laser apparatus 10 according to the first embodiment comprises, for example, two multicavity laser-diode chips 12 and a collimator-lens array 14 which are fixed to a heat block (stem) 11. The heat block 11 is made of copper, and the collimator-lens array 14 is made of synthetic resin or glass.

For example, the multicavity laser-diode chips 12 each contain GaN-based laser diode having five cavities (five light-emission points 12a) and an identical oscillation wavelength of 405 nm. The multicavity laser-diode chips 12 are arranged along the same direction as the direction along which the light-emission points 12a are aligned. In this example, the five light-emission points 12a are aligned with a pitch of 0.35 mm, and laser beams 12B each having an output power of 30 mW are emitted from the respective light-emission points 12a.

On the other hand, the heat block 11 comprises a laser-fixation surface 11a, a lens-setting surface 11b, and a concavity 11c. The laser-fixation surface 11a is a horizontal surface on which the two multicavity laser-diode chips 12 are fixed. The lens-setting surface 11b is formed on the forward side of positions at which the multicavity laser-diode chips 12 are fixed, where the forward side is a side toward which the laser beams 12B are emitted from the light-emission points 12a of the multicavity laser-diode chips 12. The concavity 11c is formed so as to avoid occurrence of an eclipse of the laser beams 12B which are emitted from the light-emission points 12a and are divergent.

The laser-fixation surface 11a of the heat block 11 is smoothed into a highly flat surface with a flatness of 0.5 micrometers or smaller. In order to ensure thermal diffusion and suppress temperature rise, the multicavity laser-diode chips 12 are fixed to each other and to the laser-fixation surface 11a with brazing material.

The lens-setting surface 11b in heat block 11 is formed perpendicular to the light-emission axes O of the multicavity laser-diode chips 12 at a predetermined distance apart from the light-emission points 12a. The lens-setting surface 11b is also smoothed into a highly flat surface with a flatness of 0.5 micrometers or smaller.

The collimator-lens array 14 is constituted by ten collimator lenses 14a which are arranged along a line and are integrally formed. Each of the collimator lenses 14a has an elongated shape obtained by cutting a portion containing an optical axis of an axially symmetric lens from the axially symmetric lens. The focal length f and the effective height of each collimator lens are 0.9 mm and 1.1 mm, respectively. In addition, the length-to-width ratio of each collimator lens is, for example, 3:1. Specifically, the pitch with which the five collimator lenses in each of the right and left halves of the ten collimator lenses 14a are arranged is 0.35 mm corresponding to the pitch of the light-emission points 12a with a precision of 0.2 micrometers or less, and the gap 14c between the right and left halves of the ten collimator lenses 14a is 0.05 mm corresponding to the gap between the two multicavity laser-diode chips 12.

Further, the collimator-lens array 14 has additional portions which jut out from both ends of the collimator-lens array 14. Two back surfaces of the additional portions are smoothed into highly flat surfaces, and used as two end surfaces 14b for attachment to the heat block 11. Thus, the collimator-lens array 14 is fixed to the heat block 11, for example, by bonding the two end surfaces 14b to the lens-setting surface 11b with an adhesive.

At the time of attachment of the collimator-lens array 14 to the heat block 11, it is necessary to position the collimator-lens array 14 so that the ten light-emission axes O of the multicavity laser-diode chips 12 coincide with the optical axes of the collimator lenses 14a, respectively. In this example, the collimator-lens array 14 can be easily and correctly positioned as above by pressing the collimator-lens array 14 against the lens-setting surface 11b and moving the collimator-lens array 14 in the vertical and horizontal directions in a plane perpendicular to the optical axes of the collimator-lens array 14.

The relative positions between the lens-setting surface 11b and the collimator-lens array 14 fixed to the heat block 11 are set so that the focal points of the collimator lenses 14a are respectively located at the light-emission points 12a of the multicavity laser-diode chips 12. Therefore, when the collimator-lens array 14 is fixed to the heat block 11, the collimator lenses 14a are automatically and appropriately positioned in the direction of the optical axes. That is, the collimator lenses 14a are automatically set in such positions that the divergent laser beams 12B are correctly collimated.

Alternatively, in order to fix the collimator-lens array 14 to the heat block 11, it is possible to bond another surface of the collimator-lens array 14 to another surface of the heat block 11. For example, it is possible to provide a mount which juts from the forward side of heat block 11 (toward the right direction in FIG. 1), and bond a surface of the collimator-lens array 14 parallel to the optical axes of the collimator-lens array 14 (e.g., the bottom surface of the collimator-lens array 14) to an upper surface of the mount.

In the first embodiment, the lens-setting surface 11b of heat block 11 is a highly flat surface as explained above. Therefore, it is possible to suppress the movement of the collimator-lens array 14 during the operation for fixing the collimator-lens array 14 to heat block 11, and correctly position the collimator-lens array 14.

In addition, the laser-fixation surface 11a of heat block 11 is also a highly flat surface as explained above. Therefore, it is possible to suppress the movement of the multicavity laser-diode chips 12 during the operation for fixing the multicavity laser-diode chips 12 to the heat block 11, and correctly position the multicavity laser-diode chips 12.

In the laser apparatus 10 according to the first embodiment, the plurality of laser beams 12B are optically multiplexed into a single laser beam having a high intensity. As illustrated in FIG. 1, the heat block 11 in the laser apparatus 10 is fixed on a base plate 21. In addition, a condensing-lens holder 22 and a fiber block 23a are fixed to the base plate 21, and a fiber holder 23 is fixed to the fiber block 23a, where the condensing-lens holder 22 holds a condensing lens 20, and the fiber holder 23 holds a light-entrance end portion of a multimode optical fiber 30.

In the above construction, the ten laser beams 12B collimated by the respective collimator lenses 14a in the collimator-lens array 14 are collected by the condensing lens 20, and converge on a light-entrance end face of a core (not shown) of the multimode optical fiber 30. Then, the ten collimated laser beams 12B enter and propagate in the core of the multimode optical fiber 30, and are optically multiplexed into a single laser beam. Thus, the optically multiplexed laser beam is output from the multimode optical fiber 30. The multimode optical fiber 30 may be a step-index type, a graded-index type, or any combination thereof.

In the above example, the condensing lens 20 is a truncated lens having a width of 6 mm, an effective height of 1.8 mm, and a focal length of 14 mm. The multimode optical fiber 30 has a core diameter of 50 micrometers and a numerical aperture (NA) of 0.2. The ten laser beams 12B are collected by the condensing lens 20, and converge on the end face of the core of the multimode optical fiber 30 with a convergence spot diameter of about 30 micrometers. The sum of the loss of the laser beams 12B in the fiber coupling and the loss during the transmission through the collimator lenses 14a and the condensing lens 20 is 10%. Thus, when the output power of each of the laser beams 12B is 30 mW, the output power of the optically multiplexed laser beam becomes 270 mW, i.e., a high-power, high-intensity laser beam is obtained.

Alternatively, it is possible to use only one multicavity laser-diode chip having ten light-emission points, instead of using the two multicavity laser-diode chips 12 each having five light-emission points. However, a curvature of the array of the light-emission points, so-called "smile," is more likely to be produced during the manufacturing process when the number of light-emission points or the chip width increases. Therefore, in order to prevent the production of the curvature, it is preferable to use a plurality of laser-diode chips each having a relatively small number of light-emission points.

The number of light-emission points in each multicavity laser-diode chip and the number of laser-diode chips are not limited to the numbers mentioned above. For example, it is possible to arrange two multicavity laser-diode chips each having seven light-emission points so as to generate fourteen laser beams, or arrange three multicavity laser-diode chips each having five light-emission points so as to generate fifteen laser beams. In the latter case, when the output power of each multicavity laser-diode chip is 30 mW, and the laser beams emitted from the plurality of multicavity laser-diode chips are optically multiplexed into a single laser beam with a loss of 10%, it is possible to obtain a high-intensity laser beam with a high output power of 405 mW.

Further, when the entire fiber module of FIG. 1 is hermetically sealed in a sealed container, the lifetime of the fiber module can be increased.

Second Embodiment

The second embodiment of the present invention will be explained below.

Figure 4:
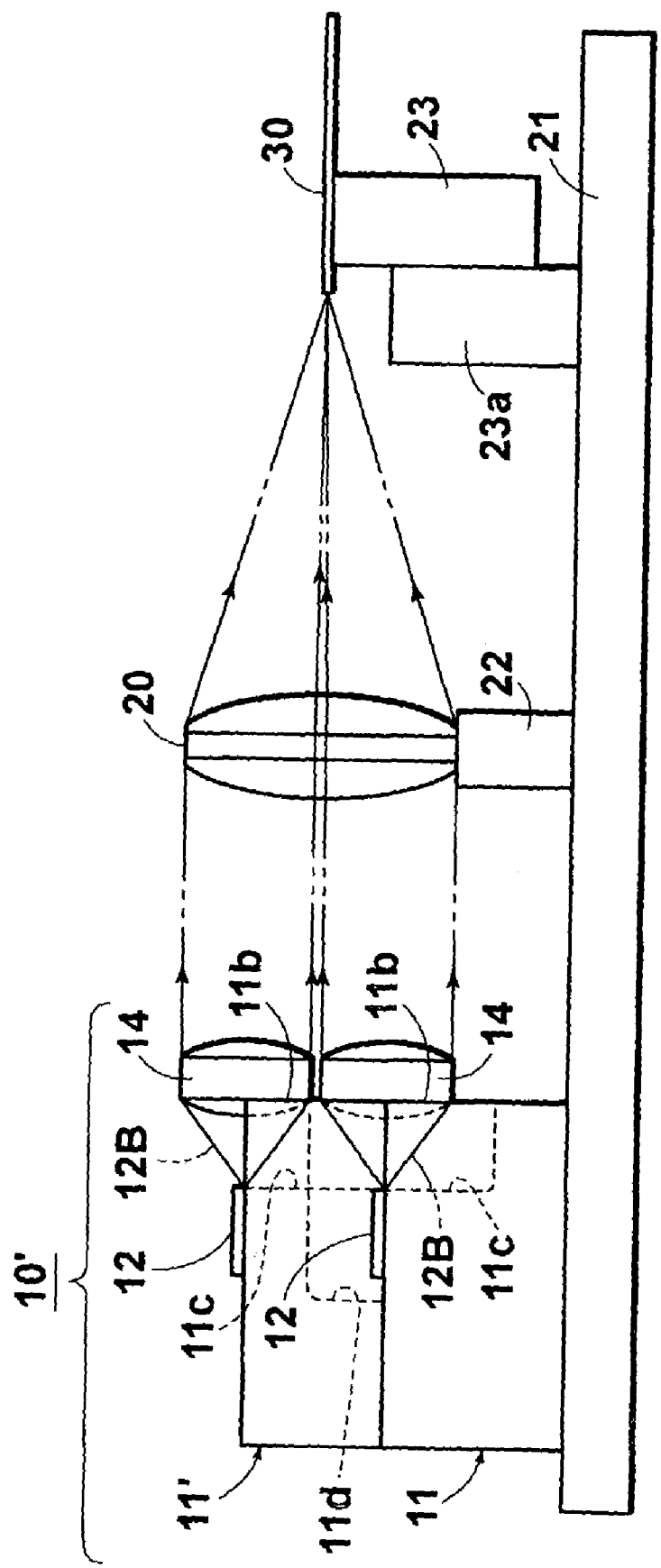
FIG. 4 is a side view of a fiber module using a laser apparatus according to a second embodiment of the present invention.
Figure 5:
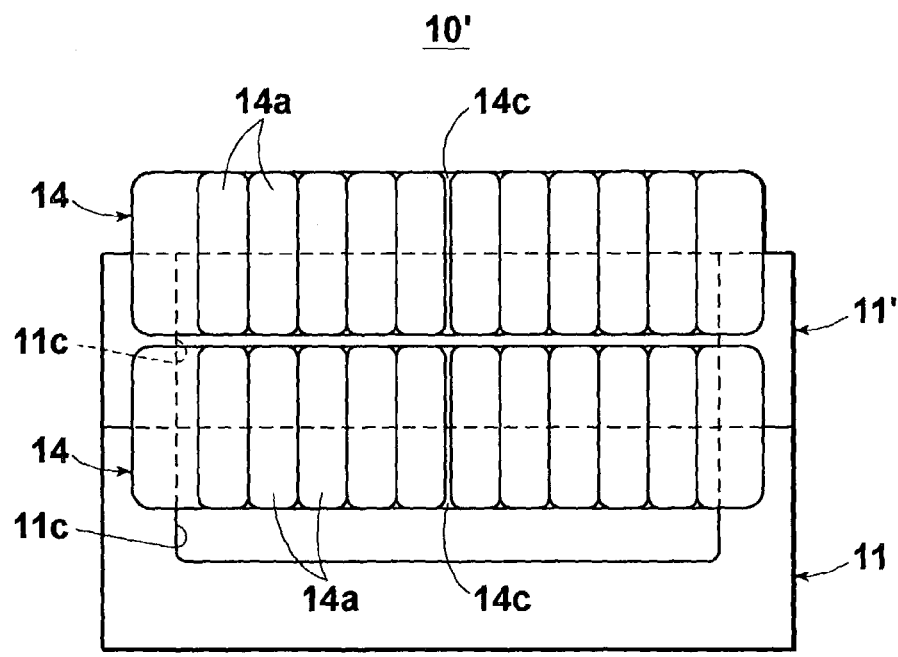
FIG. 5 is a front view of the laser apparatus used in the fiber module of FIG. 4.

FIG. 4 is a side view of a fiber module using a laser apparatus 10' according to the second embodiment of the present invention, and FIG. 5 is a front view of the laser apparatus 10' used in the fiber module of FIG. 4. The fiber module of FIG. 4 realizes an optically-multiplexing laser-light source. In FIGS. 4 and 5, elements having the same functions as the elements in the fiber module illustrated in FIG. 1 bear the same reference numerals as FIGS. 1 through 3, respectively, and are not explained below unless necessary. In addition, since the plan view of the laser apparatus 10' according to the second embodiment is basically the same as the plan view (FIG. 3) of the laser apparatus 10 according to the first embodiment, the plan view of the laser apparatus 10' is not shown.

The laser apparatus 10' according to the second embodiment is different from the laser apparatus 10 illustrated in FIGS. 1 through 3 in that two layers in each of which two multicavity laser-diode chips 12 are arranged are vertically stacked. That is, a heat block 11' similar to the aforementioned heat block 11 is stacked on the heat block 11, and two multicavity laser-diode chips 12 and a collimator-lens array 14 are fixed to the heat block 11'. In addition, the heat block 11' in the upper layer comprises a concavity 11d arranged for avoiding interference with the laser-diode chips 12 fixed on the heat block 11 in the lower layer, as well as a laser-fixation surface 11a, a lens setting surface 11b, and a concavity 11c which are respectively similar to the corresponding provisions in the heat block 11.

As in the first embodiment, at the time of attachment of each collimator-lens array 14 to each of the heat blocks 11 and 11', each collimator-lens array 14 can be easily and correctly positioned so that the light-emission axes O of the corresponding multicavity laser-diode chips 12 respectively coincide with the optical axes of the collimator lenses 14a constituting the collimator-lens array 14, by limiting the position of the collimator-lens array 14 by the lens setting surface 11b and moving the collimator-lens array 14 in the vertical and horizontal directions in a plane perpendicular to the optical axes of the collimator-lens array 14.

Each multicavity laser-diode chip 12, each collimator-lens array 14, the condensing lens 20, and the multimode optical fiber 30 in the second embodiment are identical to the corresponding elements in the first embodiment. Therefore, when the output power of each of the twenty laser beams 12B is 30 mW, it is possible to obtain a high-intensity laser beam with a high output power of 540 mW.

Third Embodiment

The third embodiment of the present invention is explained below.

Figure 6:
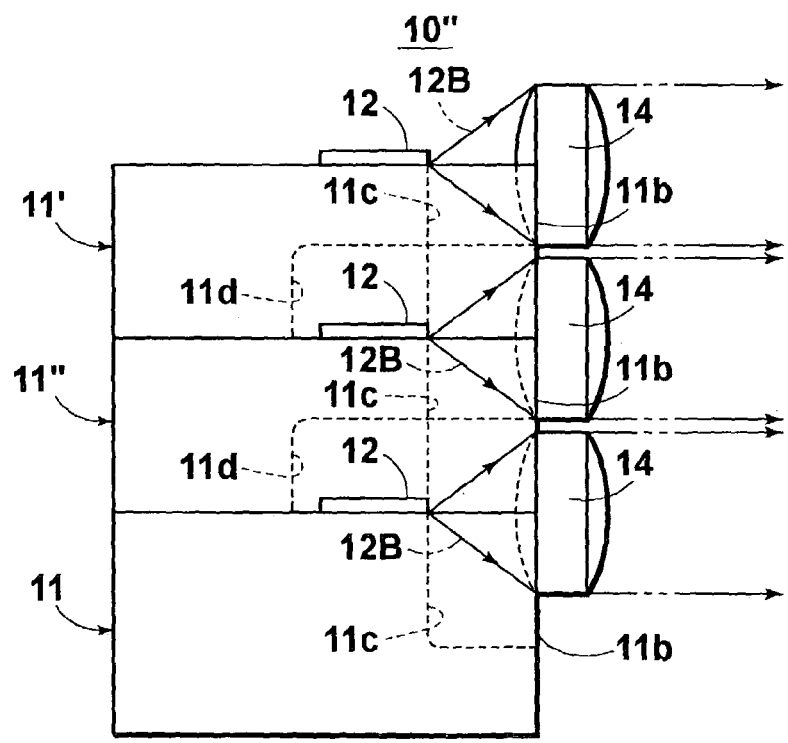
FIG. 6 is a side view of a laser apparatus according to a third embodiment of the present invention.
Figure 7:
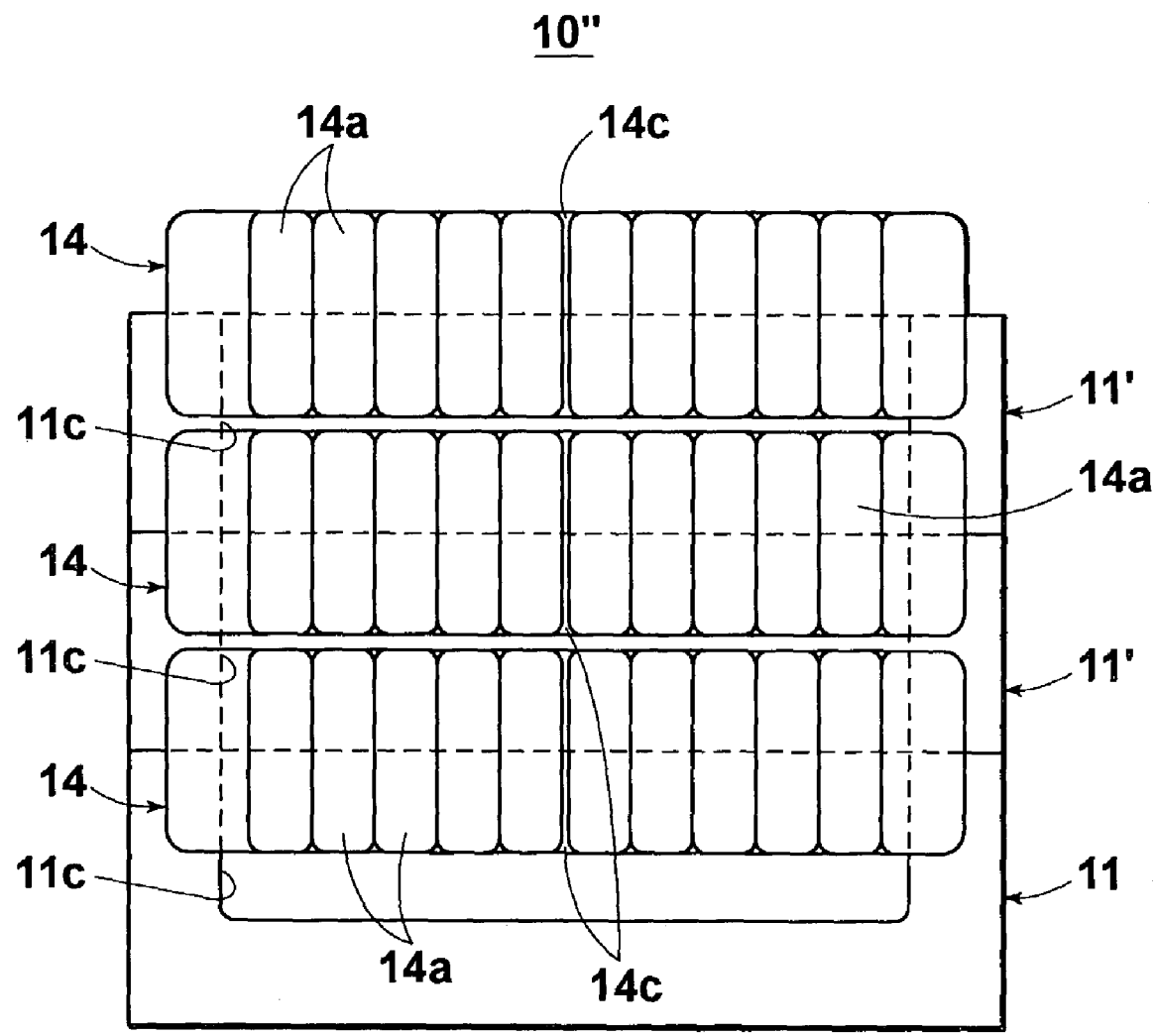
FIG. 7 is a front view of the laser apparatus of FIG. 6.

FIGS. 6 and 7 are side and front views of a laser apparatus 10" according to the third embodiment of the present invention. The laser apparatus according to the third embodiment can be used for constructing an optically-multiplexing laser-light source. In FIGS. 6 and 7, elements having the same functions as the elements in the laser apparatuses illustrated in FIGS. 1 through 5 bear the same reference numerals as FIGS. 1 through 5, respectively, and are not explained below unless necessary. Since the plan view of the laser apparatus 10" according to the third embodiment is basically the same as the plan view (FIG. 3) of the laser apparatus 10 according to the first embodiment, the plan view of the laser apparatus 10" is not shown.

The laser apparatus 10" according to the third embodiment is different from the laser apparatus 10 illustrated in FIGS. 1 through 3 in that three layers in each of which two multicavity laser-diode chips 12 are arranged are vertically stacked. That is, two heat blocks 11' each of which is identical to the heat block 11' in the second embodiment (and similar to the aforementioned heat block 11 in the first embodiment) are stacked on the heat block 11, and two multicavity laser-diode chips 12 and a collimator-lens array 14 are fixed to each of the heat blocks 11'. In addition, each of the heat blocks 11' comprises a concavity 11d arranged for avoiding interference with the laser-diode chips 12 fixed on the heat block 11' or 11 located in the lower layer, as well as a laser-fixation surface 11a, a lens setting surface 11b, and a concavity 11c which are respectively similar to the corresponding provisions in the heat block 11.

As in the first and second embodiments, at the time of attachment of the collimator-lens array 14 to each of the heat blocks 11 and 11', the collimator-lens array 14 can be easily and correctly positioned so that the light-emission axes O of the corresponding multicavity laser-diode chips 12 respectively coincide with the optical axes of the collimator lenses 14a constituting the collimator-lens array 14, by limiting the position of the collimator-lens array 14 by the lens setting surface 11b and moving the collimator-lens array 14 in the vertical and horizontal directions in a plane perpendicular to the optical axes of the collimator-lens array 14.

Each multicavity laser-diode chips 12, each collimator-lens array 14, the condensing lens 20, and the multimode optical fiber 30 in the third embodiment are identical to the corresponding elements in the first embodiment. Therefore, when the output power of each of the thirty laser beams 12B is 30 mW, it is possible to obtain a high-intensity laser beam with a high output power of 810 mW.

Fourth Embodiment

Although the multicavity laser-diode chips are used in the first through third embodiments, it is possible to use a plurality of single-cavity laser-diode chips instead of the multicavity laser-diode chips. In the fourth embodiment of the present invention, a plurality of single-cavity laser-diode chips are used.

Figure 8:
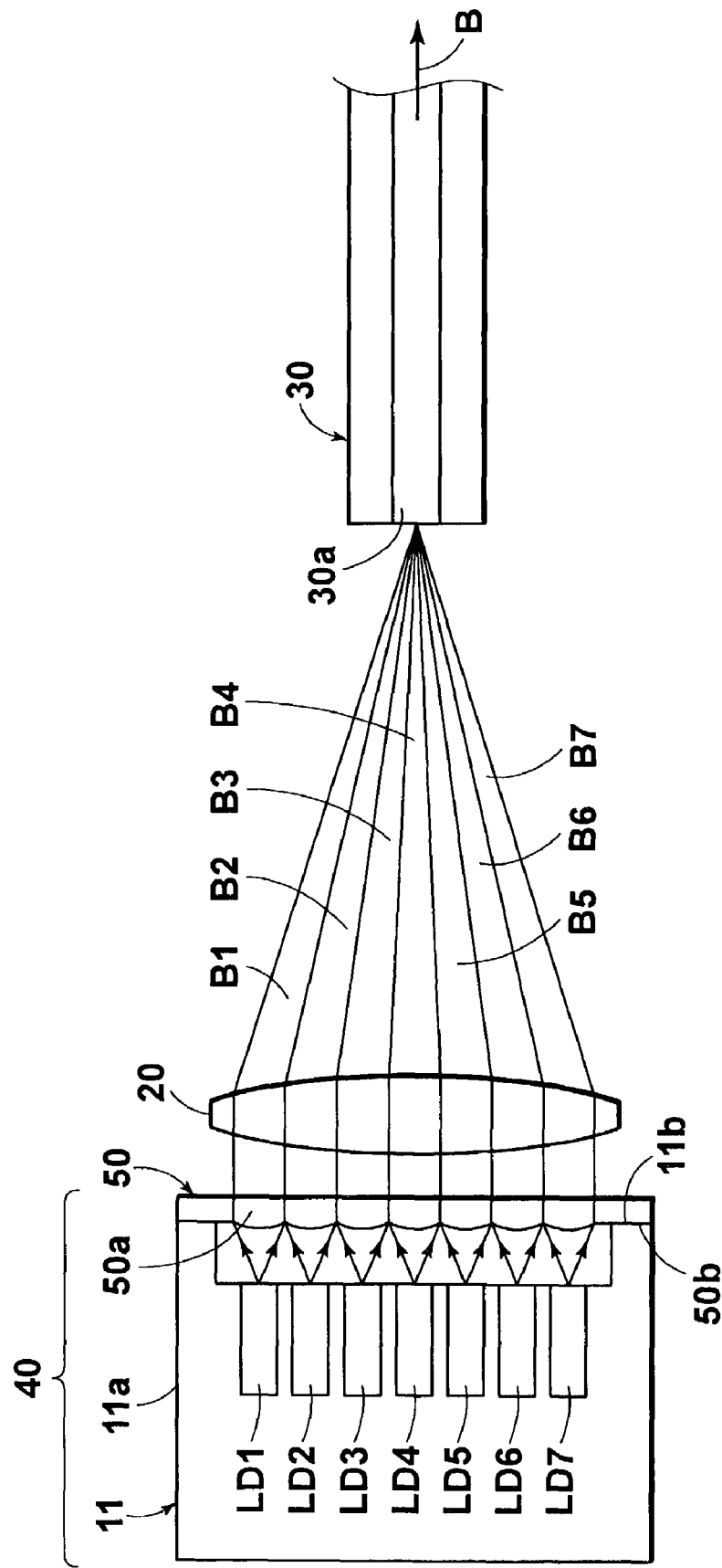
FIG. 8 is a plan view of a fiber module using a laser apparatus according to a fourth embodiment of the present invention.

FIG. 8 is a plan view of a fiber module using a laser apparatus 40 according to the fourth embodiment of the present invention. The fiber module of FIG. 8 realizes an optically-multiplexing laser-light source. In FIG. 8, elements having the same functions as the elements in the laser apparatus illustrated in FIGS. 1 through 3 bear the same reference numerals as FIGS. 1 through 3, respectively, and are not explained below unless necessary.

As illustrated in FIG. 8, seven GaN-based laser-diode chips LD1 through LD7 are arranged on the laser-fixation surface 11a of the heat block 11. Each of the GaN-based laser-diode chips LD1 through LD7 has a single cavity, and operates in multiple transverse modes. In addition, a collimator-lens array 50 is fixed to the heat block 11. The collimator-lens array 50 is constituted by seven collimator lenses 50a which are arranged along a line and integrally formed. Similar to the end surfaces 14b in the collimator-lens array 14 in the first embodiment, the collimator-lens array 50 has additional portions which jut out from both ends of the collimator-lens array 50, and two back surfaces of the additional portions are smoothed into highly flat surfaces and used as two end surfaces 50b for attachment to the heat block 11. Thus, the collimator-lens array 50 is fixed to the heat block 11, for example, by bonding the two end surfaces 50b to the lens-setting surface 11b with an adhesive or the like.

The GaN-based laser-diode chips LD1 through LD7 each have an identical oscillation wavelength of 405 nm and an identical maximum output power of 100 mW. Divergent laser beams B1 through B7 emitted from the GaN-based laser-diode chips LD1 through LD7 are respectively collimated by the collimator lenses 50a. Then, the collimated laser beams B1 through B7 are collected by the condensing lens 20, and converge on a light-entrance end face of the core 30a of the multimode optical fiber 30. In this example, an optical condensing system is constituted by the collimator lenses 50a and the condensing lens 20, and an optical multiplex system is constituted by the optical condensing system and the multimode optical fiber 30. Thus, the laser beams B1 through B7 collected by the condensing lens 20 as above enter and propagate in the core 30a of the multimode optical fiber 30, in which the laser beams B1 through B7 are optically multiplexed into a single laser beam B. Then, the laser beam B is output from the multimode optical fiber 30.

As in the first to third embodiments, at the time of attachment of the collimator-lens array 50 to the heat block 11, the collimator-lens array 50 can be easily and correctly positioned so that the light-emission axes O of the GaN-based laser-diode chips LD1 through LD7 respectively coincide with the optical axes of the collimator lenses 50a constituting the collimator-lens array 50, by limiting the position of the collimator-lens array 50 by the lens setting surface 11b and moving the collimator-lens array 50 in the vertical and horizontal directions in a plane perpendicular to the optical axes of the collimator-lens array 50.

Mounting of Laser Diodes

Figure 9:
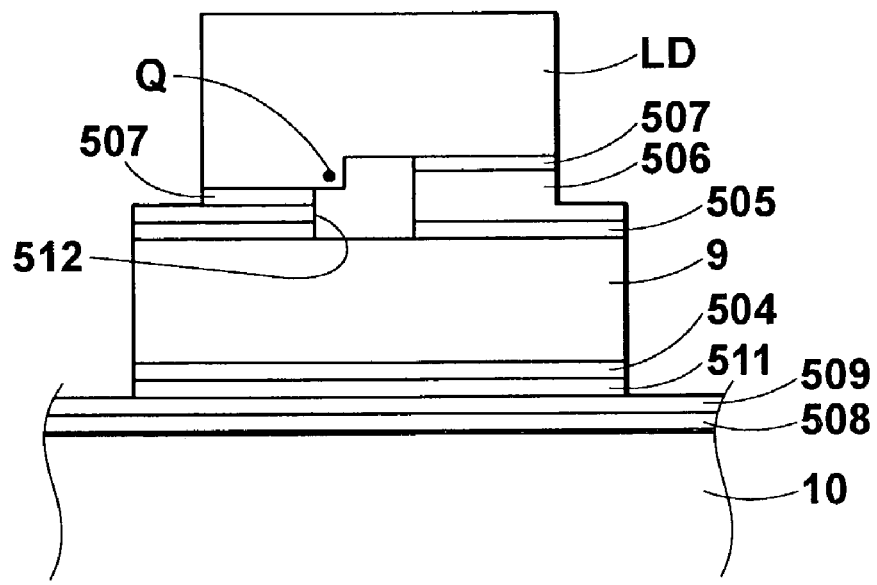
FIG. 9 is a front view of a structure for mounting a laser diode in a laser apparatus according to the present invention.
Figure 10:
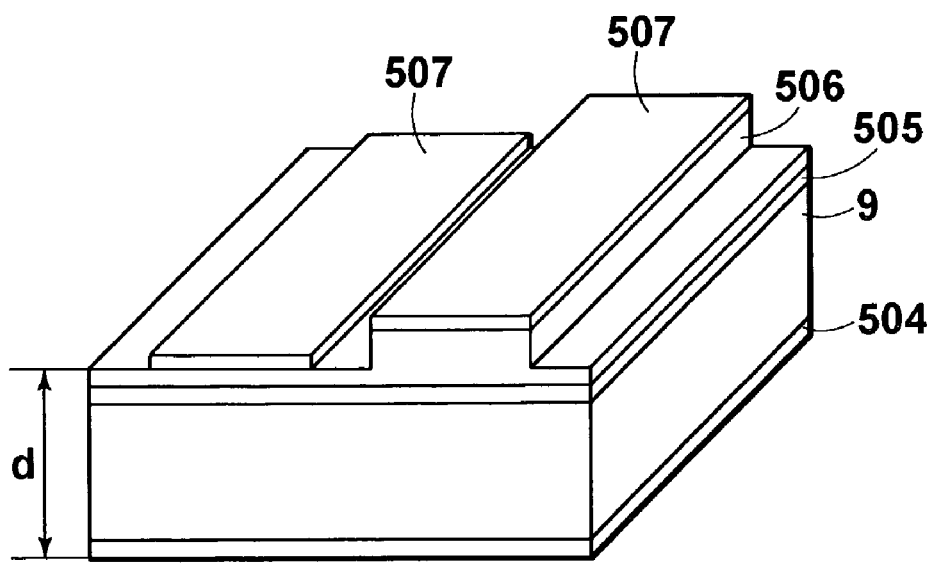
FIG. 10 is a perspective view of a portion of a structure for mounting a laser diode in a laser apparatus according to the present invention.

It is preferable that each laser-diode chip in each laser apparatus according to the present invention is mounted on a heat block through a submount. An example of mounting of a nitride-based compound laser-diode chip on a heat-dissipation block (heat block) through submounts is explained in detail below. FIG. 9 is a front view of a structure for mounting a GaN-based laser-diode chip LD1 on a heat-dissipation block 10, and FIG. 10 is a perspective view of a portion of a structure for mounting a laser diode in a laser apparatus according to the present invention. Although, in the following explanations, it is assumed that the GaN-based laser-diode chip LD has a single cavity, the structure explained below can also be used for mounting a multicavity laser-diode chip.

First, as illustrated in FIG. 10, an Au/Pt/Ti metalization layer 504 is formed on the bottom surface of the submount 9, which is made of AlN. Then, an Au/Ni plating layer 505 and an Au/Pt/Ti metalization layer 506 are formed on the top surface of the submount 9. The Au/Pt/Ti metalization layer 506 includes areas respectively having greater and smaller thicknesses (having higher and lower surfaces), i.e., the top side of the Au/Pt/Ti metalization layer 506 has a steplike shape. In this specification, the thickness d of the submount 9 does not include the above metalization or plating layers 504 to 506 as illustrated in FIG. 10.

The steplike shape of the Au/Pt/Ti metalization layer 506 can be realized by forming a uniform Au/Pt/Ti metalization layer having the greater thickness, and removing portions of the uniform Au/Pt/Ti metalization layer corresponding to the areas which should have the smaller thickness by a dry process such as ion milling or a wet process using an etchant. Alternatively, the steplike shape of the Au/Pt/Ti metalization layer 506 can be formed by forming a uniform Au/Pt/Ti metalization layer having the smaller thickness, masking the areas which should have the smaller thickness, and additionally metalizing the area which should have the greater thickness.

Next, Au—Sn eutectic solder pads 507 are arranged on the higher surface and one of the lower surfaces of the Au/Pt/Ti metalization layer 506. For example, the Au—Sn eutectic solder pads 507 each have a size of 150×500 micrometers, and separated from each other by 10 micrometers.

For example, the size of the GaN-based laser-diode chip LD1 is about 400×600×100 micrometers. The GaN-based laser-diode chip LD1 is placed on the Au—Sn eutectic solder pads 507, and bonded to the submount 9 by heating the Au—Sn eutectic solder pads 507 to 330° C. and melting the Au—Sn eutectic solder pads 507.

On the other hand, an Au/Ni plating layer 508 and an Au/Pt/Ti metalization layer 509 are formed on the Cu heat-dissipation block 10, and an Au—Sn eutectic solder layer 511 is formed on the Au/Pt/Ti metalization layer 509. Then, the submount 9 is placed on the Au—Sn eutectic solder layer 511 with the Au/Pt/Ti metalization layer 504 down, and the submount 9 is bonded to the Cu heat-dissipation block 10 by heating the Au—Sn eutectic solder layer 511 to 310° C. and melting the Au—Sn eutectic solder layer 511. Thus, the submount 9 is mounted on the Cu heat-dissipation block 10 through the submount 9.

The melting point of the Au—Sn solder varies with the Au/Sn composition. Therefore, it is possible to make a difference in the melting point between the Au—Sn eutectic solder pads 507 and the Au—Sn eutectic solder layer 511 after the Au—Sn eutectic solder pads 507 and the Au—Sn eutectic solder layer 511 are molten, by making the Au composition of each of the Au—Sn eutectic solder pads 507 and the Au—Sn eutectic solder layer 511 several percent higher than the eutectic composition. The Au compositions of the Au—Sn eutectic solder pads 507 and the Au—Sn eutectic solder layer 511 can be appropriately increased by independently controlling the thicknesses of the Au/Pt/Ti metalization layer 506 and the Au/Pt/Ti metalization layer 504 and the temperatures of the Au—Sn eutectic solder pads 507 and the Au—Sn eutectic solder layer 511 while the Au—Sn eutectic solder pads 507 and the Au—Sn eutectic solder layer 511 are molten.

In the case where a difference in the melting point between the Au—Sn eutectic solder pads 507 and the Au—Sn eutectic solder layer 511 is made as above after the Au—Sn eutectic solder pads 507 and the Au—Sn eutectic solder layer 511 are molten, the mounting of the submount 9 on the Cu heat-dissipation block 10 and the mounting of the GaN-based laser-diode chip LD1 on the submount 9 can be performed at different melting temperatures even when the Au—Sn eutectic solder pads 507 and the Au—Sn eutectic solder layer 511 are originally made of an identical Au—Sn eutectic solder. The melting temperature used for mounting the submount 9 on the Cu heat-dissipation block 10 is lower than the melting temperature used for mounting the GaN-based laser-diode chip LD1 on the submount 9. Therefore, it is unnecessary to use a low-melting-point solder. If a low-melting-point solder is used, the position of the light-emission point is likely to vary with elapse of time. Thus, in order to suppress variations in the position of the light-emission point, it is advantageous to make a difference in the melting point as explained above.

In addition, in this example, the GaN-based laser-diode chip LD is junction-side-down mounted on the Cu heat-dissipation block 10. That is, the GaN-based laser-diode chip LD is arranged so that a substrate is located on the upper side, and the side of the GaN-based laser-diode chip LD on which a laser structure (realized by pn junctions) is formed is located on the lower side. In this example, the substrate is made of $Al_2O_3$.

Further, the light-emission point of the GaN-based laser-diode chip LD is located at the position approximately indicated by the reference Q in FIG. 9. A groove 512 is formed in the Au—Sn eutectic solder pads 507, the Au/Pt/Ti metalization layer 506, and the Au/Ni plating layer 505, and the GaN-based laser-diode chip LD is bonded to the submount 9 so that the groove is located immediately below a light emission region of the GaN-based laser-diode chip LD. That is, the light emission region per se of the GaN-based laser-diode chip LD is not directly bonded to the submount, and therefore the stress exerted on the light emission region can be reduced. Furthermore, in the case where the groove 512 is formed, it is possible to prevent the submount 9 from eclipsing an emitted light beam even when the light-emission end facet of the GaN-based laser-diode chip LD is recessed from the end face of the submount 9.

It is possible to form an n electrode of the GaN-based laser-diode chip LD at an area which is to be opposed to the higher surface of the Au/Pt/Ti metalization layer 506, form the Au/Pt/Ti metalization layer 506 so as to insulate the thicker area and thinner areas of the Au/Pt/Ti metalization layer 506 from each other, and electrically connect the n electrode to the thicker area, and a p electrode to one of the thinner areas.

In this example, the heat-dissipation block 10 is made of copper, which has high thermal conductivity and is not expensive. Therefore, the Cu heat-dissipation block 10 can effectively dissipate heat generated by the GaN-based laser-diode chip LD, and can be manufactured at low cost.

In addition, in this example, the GaN-based laser-diode chip LD is fixed to the submount 9 in a junction-side-down structure. Therefore, the light emission region of the GaN-based laser-diode chip LD is located nearer to the submount 9 and the Cu heat-dissipation block 10, compared with structures in which the substrate side of the GaN-based laser-diode chip LD is bonded to the submount 9. Therefore, in this respect, the heat is further effectively dissipated.

Further, the GaN-based laser-diode chip LD is bonded to the submount 9 with the Au—Sn eutectic solder pads 507, and the Au—Sn eutectic solder is superior in characteristics relating to locational variations with elapse of time. Therefore, it is possible to effectively prevent the variations in the location of the light-emission point with elapse of time.

Figure 11:
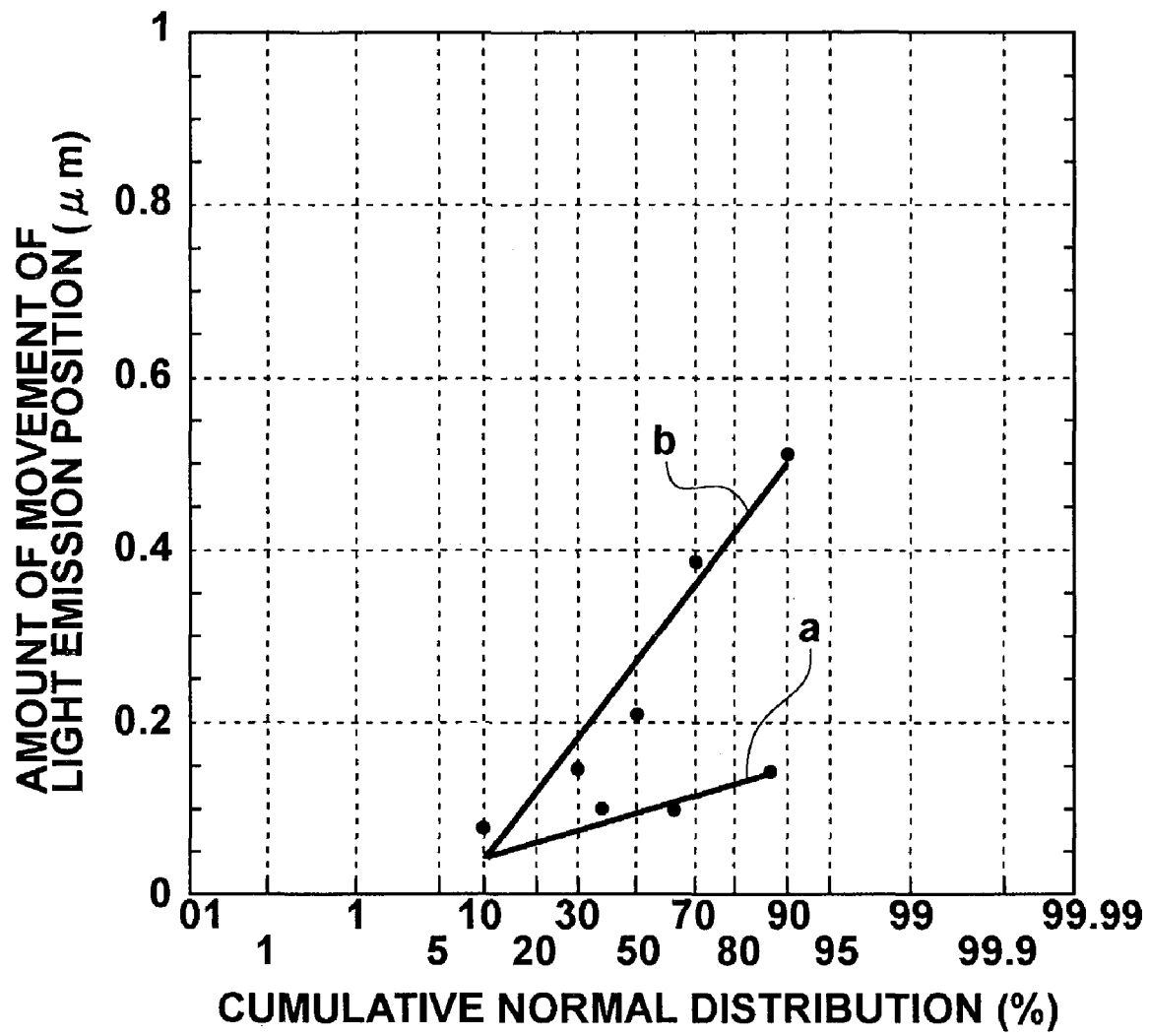
FIG. 11 is a graph indicating variations of the amount of movement of a light-emission point in a laser diode used in the laser apparatus having the structure of FIG. 9, in comparison with variations of the amount of movement of a light-emission point in a conventional laser diode.

Amounts of vertical movement of light-emission points of GaN-based laser-diode chips which are mounted as above by using different solder materials and have undergone aging tests performed at −40° C. to 80° C. have been measured. The results of the measurement are indicated in FIG. 11, where the ordinate corresponds to the amount of vertical movement of the light-emission point, and the abscissa corresponds to a cumulative normal distribution (%) of the amount of vertical movement of the light-emission point. In FIG. 11, the results in the case where the solder material is the Au—Sn eutectic solder are indicated by the reference a, and the results in the case where the solder material is the low-melting-point solder are indicated by the reference b. As indicated in FIG. 11, the amount of vertical movement of the light-emission point of the GaN-based laser-diode chip in the case of the Au—Sn eutectic solder is significantly reduced in comparison with that in the case of the low-melting-point solder.

Figure 12:
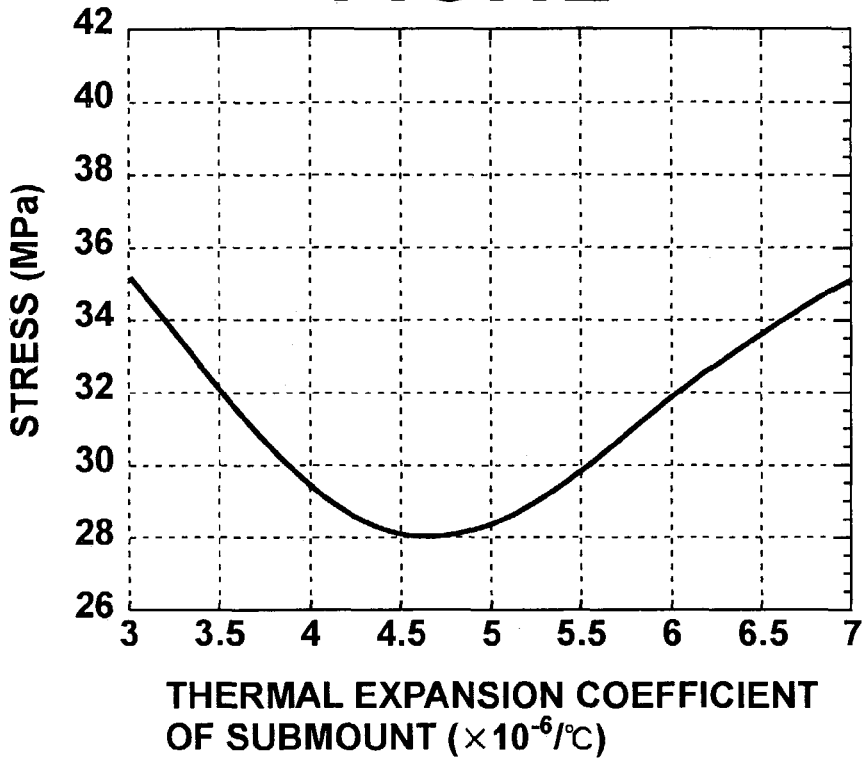
FIG. 12 is a graph indicating a relationship between the thermal expansion coefficient of a submount under the laser diode used in the laser apparatus having the structure of FIG. 9 and the stress exerted on the light-emission point.

FIG. 12 shows a result of a computer simulation indicating how the stress caused by thermal strain and exerted on the light-emission point of the mounted GaN-based laser-diode chip LD varies with the thermal expansion coefficient of the submount. For use in the simulation, numerical values of the thicknesses, thermal expansion coefficients, and Young's moduli of the submount 9, the Cu heat-dissipation block 10, the Au/Pt/Ti metalization layers 504, 506, and 509, the Au/Ni plating layers 505 and 508, the Au—Sn eutectic solder layers 507 and 511, and the substrate, a lower cladding layer, a light emission layer, an upper cladding layer, and an insulation film of the GaN-based laser-diode chip LD, except for the thermal expansion coefficient of the AlN submount 9, were obtained and used.

As indicated in FIG. 12, when the thermal expansion coefficient of the submount 9 is within the range of 3.5 to 6.0× $10^{-6}/°$ C., the above stress becomes equal to about 32 MPa or smaller, i.e., the stress is limited within such a range that the stress does not cause a substantial problem in practical use of the GaN-based laser-diode chip LD. In consideration of the above result, the submount 9 in the laser apparatus according to the present invention is made of a material having a thermal expansion coefficient within the range of 3.5 to 6.0×$10^{-6}/°$ C.

In addition, it is preferable that the thermal expansion coefficient of the submount 9 is within the range of 4.0 to 5.4×$10^{-6}/°$ C., since the stress becomes about 29.5 MPa or smaller when the thermal expansion coefficient is within this range. It is more preferable that the thermal expansion coefficient of the submount 9 is within the range of 4.4 to 4.8× $10^{-6}/°$ C., since the stress becomes about 28 MPa when the thermal expansion coefficient is within this range. The thermal expansion coefficient of AlN, of which the submount 9 in this example is made, is 4.5×$10^{-6}/°$ C., which is within the most preferable range.

Figure 13:
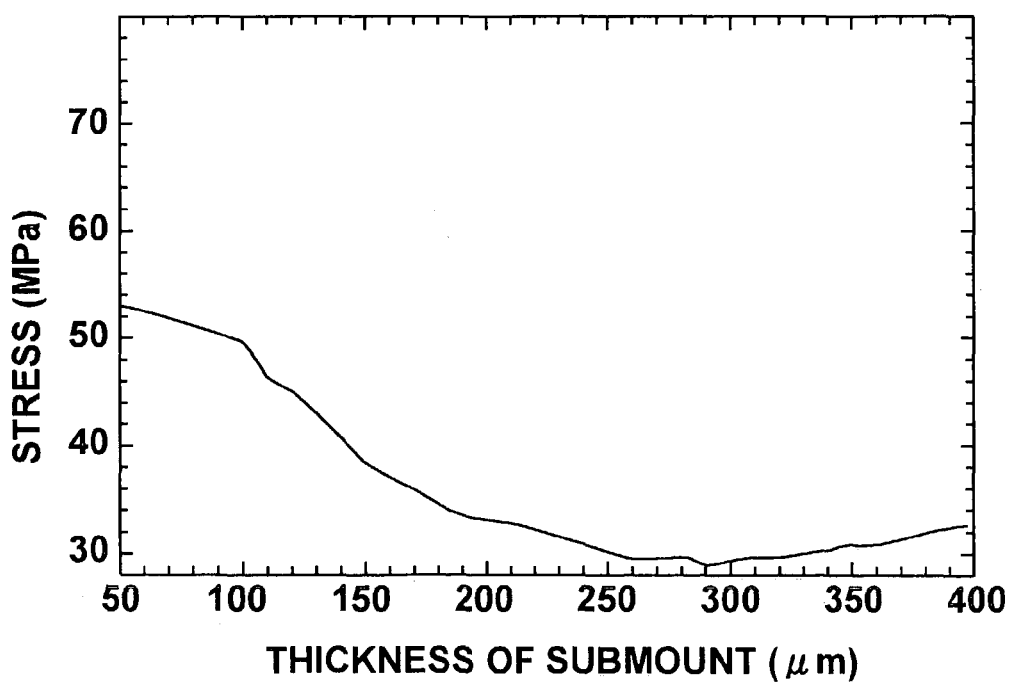
FIG. 13 is a graph indicating a relationship between the thickness of a submount under the laser diode used in the laser apparatus having the structure of FIG. 9 and the stress exerted on the light-emission point.

FIG. 13 shows a result of a computer simulation indicating how the stress caused by thermal strain and exerted on the light-emission point of the mounted GaN-based laser-diode chip LD varies with the thickness of the AlN submount 9. For use in this simulation, numerical values of the thicknesses, thermal expansion coefficients, and Young's moduli of the AlN submount 9, the Cu heat-dissipation block 10, the Au/Pt/Ti metalization layers 504, 506, and 509, the Au/Ni plating layers 505 and 508, the Au—Sn eutectic solder layers 507 and 511, and the substrate, the lower cladding layer, the light emission layer, the upper cladding layer, and the insulation film of the GaN-based laser-diode chip LD were obtained and used.

As indicated in FIG. 13, when the thickness of the AlN submount 9 is within the range of 200 to 400 micrometers, the above stress becomes equal to about 34 MPa or smaller, i.e., the stress is limited within such a range that the stress does not cause a substantial problem in practical use of the GaN-based laser-diode chip LD. In other words, when stress exceeding about 34 MPa is exerted on the light-emission point of the GaN-based laser-diode chip LD, displacement of the light-emission point is likely to occur. In consideration of the above result, it is preferable that the AlN submount 9 in each laser apparatus according to the present invention is made of a material having a thickness within the range of 200 to 400 micrometers. In addition, it is more preferable that the thickness of the AlN submount 9 is within the range of 250 to 350 micrometers, since the stress becomes about 32 MPa or smaller when the thickness is within this range.

Further, the AlN submount 9 receives great compressive stress from the Cu heat-dissipation block 10. Although the AlN submount 9 also receives compressive stress from the GaN-based laser-diode chip LD, generally, the compressive stress received from the GaN-based laser-diode chip LD is smaller than the compressive stress received from the Cu heat-dissipation block 10.

In constructions in which laser beams emitted from a plurality of laser diodes are collected and coupled to a multimode optical fiber as in the laser apparatus of FIG. 8, the coupling efficiency decreases when the positions of the light-emission points vary with elapse of time. Therefore, the decrease in the coupling efficiency can be prevented by suppressing the variations of the positions of the light-emission points.

Fifth Embodiment

Figure 14:
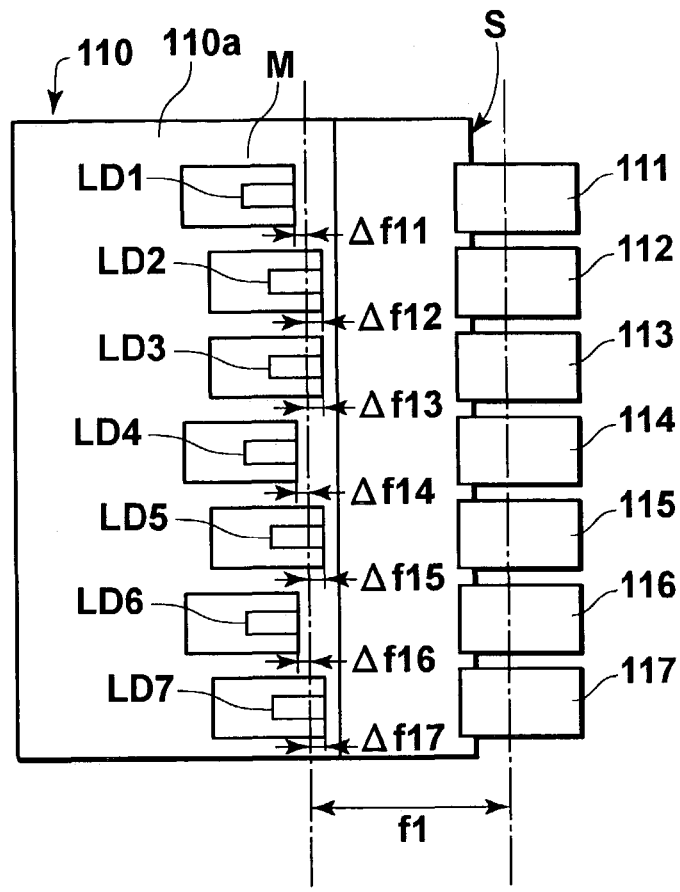
FIG. 14 is a plan view of a laser apparatus according to a fifth embodiment of the present invention.
Figure 15:
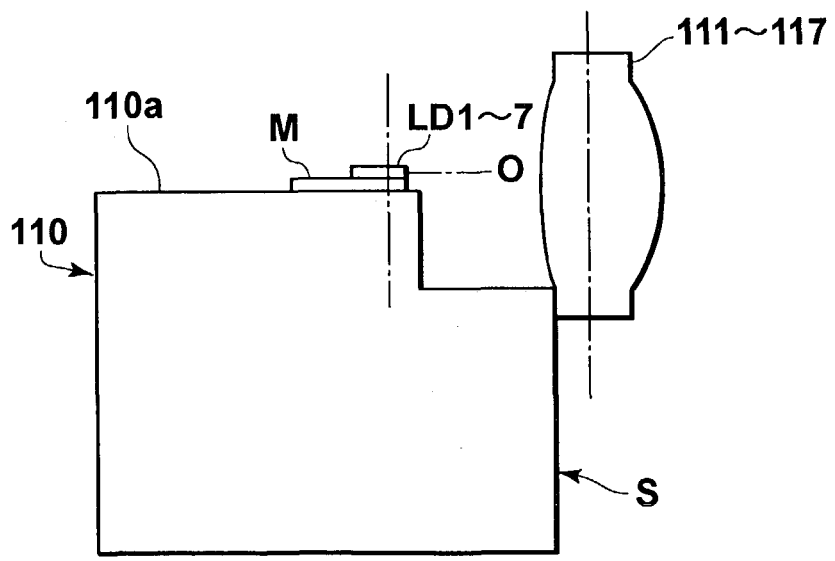
FIG. 15 is a side view of the laser apparatus of FIG. 14.
Figure 16:
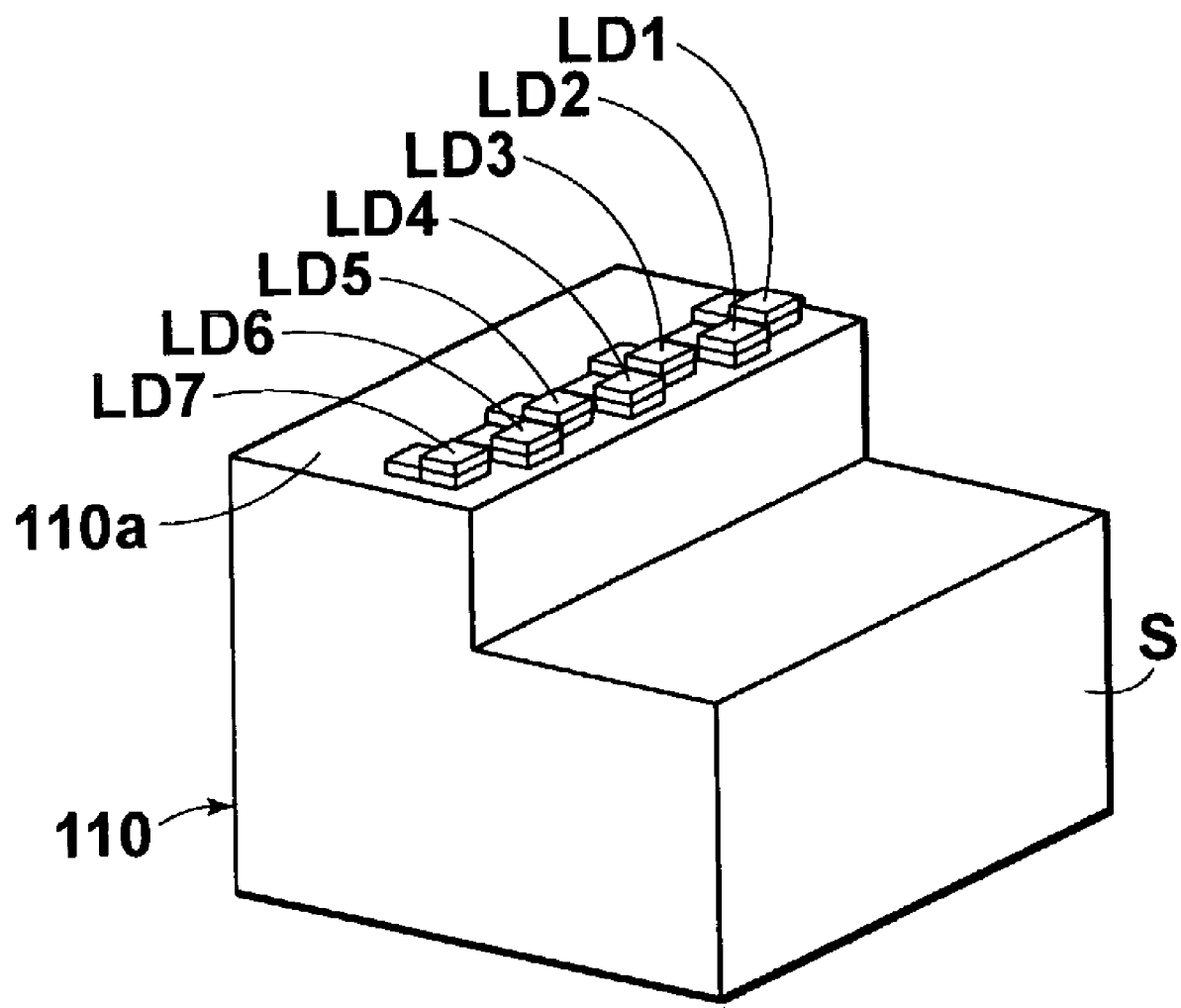
FIG. 16 is a perspective view illustrating a portion of the laser apparatus of FIG. 14.

FIGS. 14 and 15 are plan and side views of a laser apparatus according to the fifth embodiment of the present invention, and FIG. 16 is a perspective view illustrating a portion of the laser apparatus of FIG. 14. The laser apparatus according to the fifth embodiment can be used for constructing an optically-multiplexing laser-light source.

As illustrated in FIGS. 14, 15, and 16, seven GaN-based laser-diode chips LD1 through LD7 are fixed on a horizontal laser-fixation surface 110a of a heat block (heat sink) 110 made of copper, and a plurality of collimator lenses 111 through 117 are arranged in correspondence with the GaN-based laser-diode chips LD1 through LD7. Each of the GaN-based laser-diode chips LD1 through LD7 operates in multiple transverse modes.

Figure 17:
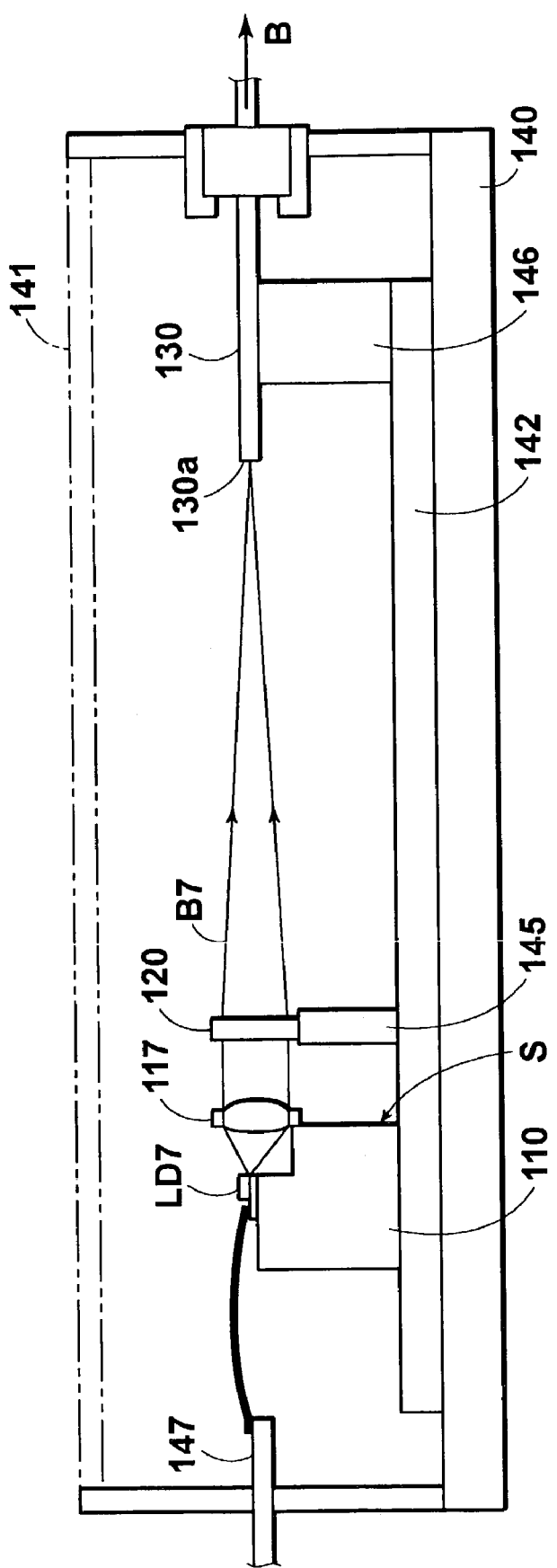
FIG. 17 is a side view of a high-intensity ultraviolet-light optically-multiplexing fiber module using the laser apparatus illustrated in FIGS. 14 and 15.
Figure 18:
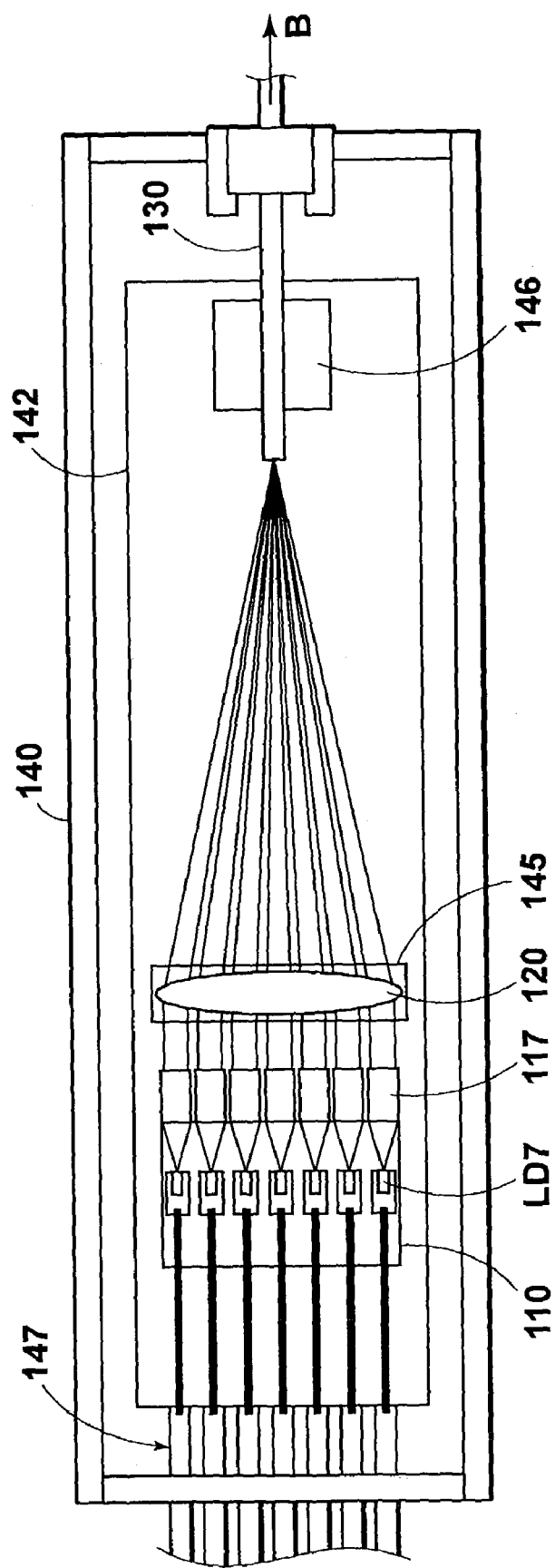
FIG. 18 is a plan view of the optically-multiplexing fiber module of FIG. 17.
Figure 19:
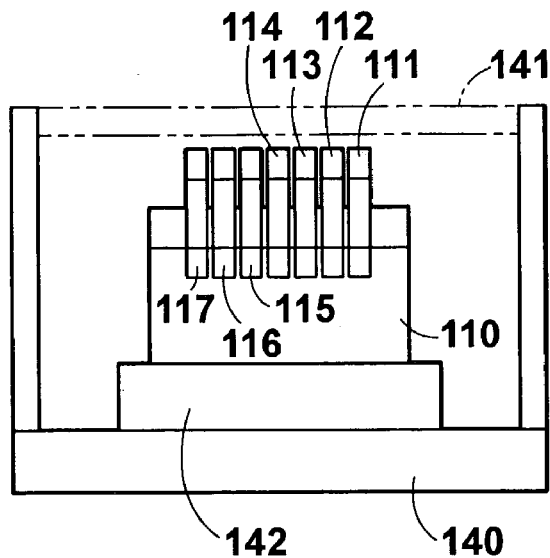
FIG. 19 is a front view of a portion of the optically-multiplexing fiber module of FIGS. 17 and 18.

FIGS. 17 and 18 are side and plan views of a high-intensity ultraviolet-light optically-multiplexing fiber module (laser-light source) using the laser apparatus illustrated in FIGS. 14 and 15, and FIG. 19 is a front view of a portion of the fiber module of FIG. 17. The construction and operations of the fiber module illustrated in FIGS. 17, 18, and 19 will be explained later in detail.

Although the GaN-based laser-diode chips LD1 through LD7 may be directly mounted on the heat block 110, each of the GaN-based laser-diode chips LD1 through LD7 in the fifth embodiment is mounted on a submount M, and each submount M on which one of the GaN-based laser-diode chips LD1 through LD7 is mounted is mounted on the laser-fixation surface 110a of the heat block 110. That is, each of the GaN-based laser-diode chips LD1 through LD7 is fixed to the laser-fixation surface 110a of the heat block 110 through the submount M. Details of the mounting of the GaN-based laser-diode chips LD1 through LD7 on the heat block 110 are illustrated in FIG. 16.

Hereinbelow, the mounting of the GaN-based laser-diode chips LD1 through LD7 and the collimator lenses 111 through 117 is explained in detail.

In advance, the focal lengths of the collimator lenses 111 through 117 are measured by a separate measurement system. At this time, for example, deviations $\Delta f11$ through $\Delta f17$ from a designed focal length f1 are obtained, where the designed focal length f1 is determined with reference to production reference surfaces of the collimator lenses 111 through 117.

The heat block 110 is formed to have a reference surface S. When the GaN-based laser-diode chips LD1 through LD7 mounted on the submounts M are successively placed on the heat block 110 so as to form an array, the production reference surfaces of the collimator lenses 111 through 117 are placed in contact with the reference surface S, and the positions of the GaN-based laser-diode chips LD1 through LD7 in the direction of the optical axes (i.e., in the direction of the focal length or horizontal direction in FIGS. 14 and 15) are determined to be the positions respectively shifted by the above deviations $\Delta f11$ through $\Delta f17$ from the positions corresponding to the designed focal length f1 (=3 mm) determined with reference to the reference surface S. In the operation of positioning the GaN-based laser-diode chips LD1 through LD7, the chip edges of the GaN-based laser-diode chips LD1 through LD7 corresponding to the light-emission end faces thereof are used as reference positions of the GaN-based laser-diode chips LD1 through LD7.

In addition, the positions of the GaN-based laser-diode chips LD1 through LD7 in the direction of the array of the GaN-based laser-diode chips LD1 through LD7 are determined with a designed pitch of 1.25 mm. Since a step for adjusting the positions of the collimator lenses 111 through 117 in the array direction is performed later, high precision is not required in the positioning of the collimator lenses 111 through 117 in the array direction.

After the above determination of the positions of the GaN-based laser-diode chips LD1 through LD7, the submounts M on which the GaN-based laser-diode chips LD1 through LD7 are mounted are fixed to the heat block 110 so that the GaN-based laser-diode chips LD1 through LD7 are located at the positions determined as above.

Although the reference surface S is a surface of the heat block 110 in the fifth embodiment, alternatively, it is possible to use a surface of a separate element as the reference surface S. However, in consideration of precision and cost of parts, it is preferable that the reference surface S is a surface of the heat block 110.

When the GaN-based laser-diode chips LD1 through LD7 are mounted on the heat block 110 as above, each of the collimator lenses 111 through 117 is placed in contact with the reference surface S of the heat block 110, and the distance between the collimator lens and a corresponding one of the GaN-based laser-diode chips LD1 through LD7 becomes equal to the actually measured value of the focal length of the collimator lens. That is, the distances between the collimator lenses 111 through 117 and the corresponding GaN-based laser-diode chips LD1 through LD7 become the actually measured values $f1+\Delta f11$ through $f1+\Delta f17$ of the focal lengths of the collimator lenses, respectively. Therefore, divergent laser beams B1 through B7 emitted from the GaN-based laser-diode chips LD1 through LD7 are respectively collimated by the collimator lenses 111 through 117 which are fixed to the reference surface S of the heat block 110, as illustrated in FIG. 18. Thus, it is unnecessary to further adjust the positions of the collimator lenses 111 through 117 in the optical-axis direction, and provide a lens holder for adjustment and fixation of an optical axis.

Next, details of adjustment of the laser beams B1 through B7 emitted from the GaN-based laser-diode chips LD1 through LD7 will be explained below.

It is important that the axes of the laser beams B1 through B7 are parallel to each other. Although these laser beams are collimated, the axes of the collimated laser beams are originally not parallel to each other. Therefore, it is necessary to make the directions of the laser beams parallel by pressing the collimator lenses 111 through 117 against the reference surface S which is perpendicular to the laser emission axes O so as to maintain the distances from the respectively corresponding GaN-based laser-diode chips, and adjusting and fixing the positions of the collimator lenses 111 through 117 in a plane perpendicular to the laser emission axes O.

Although, at this time, the collimator lenses 111 through 117 are pressed against the reference surface S, in order to maintain repeatability in the focal direction, it is necessary to produce the collimator lenses 111 through 117 and the heat block 110 so as to limit the surface roughnesses of the lens surfaces and the reference surface S to small amounts. It is preferable that the center-line-average roughness Ra is one micrometer or less. Normally, the positions of the collimator lenses 111 through 117 in the above plane are adjusted by activating the GaN-based laser-diode chips LD1 through LD7, and making the collimated laser beams pass through a condensing lens and be focused in an NFP (near-field-pattern) optical system so that the images of the laser beams converge on a point. That is, the position of each of the collimator lenses 111 through 117 in the plane perpendicular to the laser emission axes O is adjusted with respect to a corresponding one of the GaN-based laser-diode chips LD1 through LD7, and is successively fixed to the heat block 110. In addition, each of the collimator lenses 111 through 117 is fixed to the heat block 110 at only one place, and therefore the construction of the alignment system can be simplified. Thus, it is expected that the laser apparatus can be assembled in a small number of man-hours with high reliability.

Although, in the fifth embodiment, the focal length of each of the collimator lenses 111 through 117 is measured by using a separate measurement system, an alternative method comprising the following steps (1) to (4) may be used.

(1) One of the GaN-based laser-diode chips LD1 through LD7 corresponding to the collimator lens is activated online by powering the GaN-based laser-diode chip through a probing system or the like.

(2) The GaN-based laser-diode chip is moved in the focal direction with respect to the position of the collimator lens, and a position of the GaN-based laser-diode chip at which the spread of a laser beam emitted from the GaN-based laser-diode chip and collimated through the collimator lens is minimized is searched for by use of an FFP (far-field-pattern) optical system or the like.

(3) The position at which the spread is minimized is determined to be the focal point of the collimator lens.

(4) The GaN-based laser-diode chip is mounted on the heat block 110 at the focal point determined as above.

Next, the construction and operations of the fiber module illustrated in FIGS. 17, 18, and 19 are explained in detail below. As mentioned before, FIGS. 17 and 18 are side and plan views of the fiber module using the laser apparatus illustrated in FIGS. 14 and 15, and FIG. 19 is a front view of a portion of the fiber module of FIGS. 17 and 18. However, in FIGS. 17 and 18, in order to simplify the illustration, the reference numbers of the GaN-based laser-diode chips LD1 through LD6 and the collimator lenses 111 through 116 are not shown.

The GaN-based laser-diode chips LD1 through LD7 each have an identical oscillation wavelength of 405 nm and an identical maximum output power of 100 mW. Divergent laser beams B1 through B7 emitted from the GaN-based laser-diode chips LD1 through LD7 are respectively collimated by the collimator lenses 111 through 117. Then, the collimated laser beams B1 through B7 are collected by the condensing lens 120, and converge on a light-entrance end face of the core 130a of the multimode optical fiber 130. In this example, an optical condensing system is constituted by the collimator lenses 111 through 117 and the condensing lens 120, and an optical multiplex system is constituted by the optical condensing system and the multimode optical fiber 130. Thus, the laser beams B1 through B7 collected by the condensing lens 120 as above enter and propagate in the core 130a of the multimode optical fiber 130, in which the laser beams B1 through B7 are optically multiplexed into a single laser beam B. Then, the laser beam B is output from the multimode optical fiber 130. The multimode optical fiber 130 may be a step-index type, a graded-index type, or any combination thereof.

In this example, the optical elements constituting the fiber module are contained in a box type package 140, which has an opening on the upside. By closing the opening with a cover 141, the fiber module is hermetically sealed and held within the closed space realized by the package 140 and the cover 141.

A base plate 142 is fixed on the inner bottom surface of the package 140, and the aforementioned heat block 110 is fixed on the upper surface of the base plate 142. In addition, a condensing-lens holder 145 for holding the condensing lens 120 and a fiber holder 146 for holding a light-entrance end of the multimode optical fiber 130 are fixed on the upper surface of the base plate 142. Further, wirings 147 for supplying driving currents to the GaN-based laser-diode chips LD1 through LD7 are led out of the package 140 through openings formed in a sidewall of the package 140.

Figure 20A:
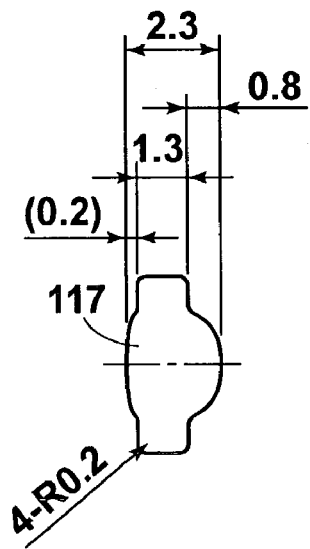
FIG. 20A is a side view of one of the collimator lenses used in the optically-multiplexing fiber module of FIG. 17.
Figure 20B:
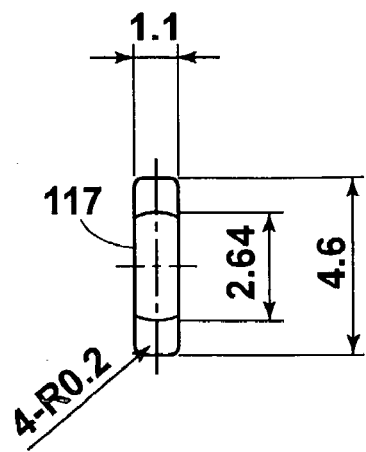
FIG. 20B is a front view of the collimator lens of FIG. 20A.

FIG. 19 shows a portion of the fiber module of FIG. 17 in which the collimator lenses 111 through 117 are mounted. Each of the collimator lenses 111 through 117 has an elongated shape which is obtained by cutting an aspherical round lens so as to leave a portion containing the optical axis of the aspherical round lens. For example, the collimator lenses 111 through 117 can be formed by molding from resin or optical glass. FIGS. 20A and 20B are magnified, side and front views of the collimator lens 117 as a representative of the collimator lenses 111 through 117 used in the fiber module of FIG. 17. In addition, examples of dimensions (in millimeters) of the essential portions are also indicated in FIGS. 20A and 20B.

The collimator lenses 111 through 117 illustrated in FIGS. 19, 20A, and 20B each have an aperture which has a first diameter parallel to the direction in which light emission points of the GaN-based laser-diode chips LD1 through LD7 are arranged (i.e., the horizontal direction in FIG. 19) and a second diameter in the direction (i.e., the vertical direction in FIG. 19) perpendicular to the first diameter and greater than the first diameter. The collimator lenses 111 through 117 are arranged close to each other in the direction in which light emission points of the GaN-based laser-diode chips LD1 through LD7 are aligned.

Each of the GaN-based laser-diode chips LD1 through LD7 has an emission width of 2 micrometers, and each of the laser beams B1 through B7 emitted from the GaN-based laser-diode chips LD1 through LD7 has a spread angle of 10° in the minor axis direction parallel to the active layer of the GaN-based laser-diode chip and a spread angle of 30° in the major axis direction perpendicular to the active layer. In addition, the GaN-based laser-diode chips LD1 through LD7 are arranged so that the light emission points of the GaN-based laser-diode chips LD1 through LD7 are aligned along a line parallel to the active layers of the GaN-based laser-diode chips LD1 through LD7.

The laser beams B1 through B7 respectively enter the collimator lenses 111 through 117 in such a manner that the direction in which the spread angle of each of the laser beams B1 through B7 is maximized coincides with the direction of the greater diameter of the elongated aperture of each of the collimator lenses 111 through 117, and the direction in which the spread angle of each of the laser beams B1 through B7 is minimized coincides with the direction of the smaller diameter of the elongated aperture of each of the collimator lenses 111 through 117. Since the elliptic cross sections of the incident laser beams B1 through B7 fit well with the elongated shapes of the collimator lenses 111 through 117, it is possible to minimize portions of the apertures of the collimator lenses 111 through 117 which are not effectively used. In other words, the collimator lenses 111 through 117 can be efficiently used.

Specifically, in the fifth embodiment, the aperture diameters of each of the collimator lenses 111 through 117 in the horizontal and vertical directions are respectively 1.1 mm and 4.6 mm, and the beam diameters of each of the incident laser beams B1 through B7 in the horizontal and vertical directions are respectively 0.9 mm and 2.6 mm. In addition, the collimator lenses 111 through 117 each have a focal length f1 of 3 mm and a numerical aperture (NA) of 0.6, and are arranged with a lens pitch of 1.25 mm.

Figures 21A, 21B:
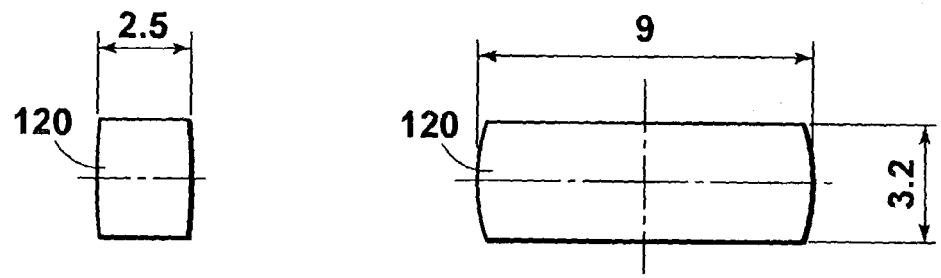
FIG. 21A is a side view of a condensing lens used in the optically-multiplexing fiber module of FIG. 17.
FIG. 21B is a front view of the condensing lens of FIG. 21A.

FIGS. 21A and 21B are magnified, side and front views of the condensing lens 120. In addition, examples of dimensions (in millimeters) of the essential portions are also indicated in FIGS. 21A and 21B. As illustrated in FIGS. 21A and 21B, the condensing lens 120 has an elongated shape which is obtained by cutting an aspherical round lens so as to leave a portion containing the optical axis of the aspherical round lens. The condensing lens 120 is elongated in a horizontal direction along which the collimator lenses 111 through 117 are arranged, and is short in the vertical direction. In this example, the condensing lens 120 has a focal length f2 of 12.5 mm and a numerical aperture (NA) of 0.3. For example, the condensing lens 120 can be formed by molding from resin or optical glass.

On the other hand, the multimode optical fiber 130 is formed by using the graded-index type optical fiber manufactured by Mitsubishi Cable Industries, Ltd as its base. The multimode optical fiber 130 has a core diameter of 25 micrometers and a numerical aperture (NA) of 0.3, and the transmittance of the end face coating is 99.5% or greater. In this example, the core diameter multiplied by the NA is 7.5 micrometers.

In the construction of the fifth embodiment, the coupling efficiency of the laser beams B1 through B7 to the multimode optical fiber 130 is 0.9. Therefore, when the output power of each of the GaN-based laser-diode chips LD1 through LD7 is 100 mW, the output power of the optically multiplexed laser beam B becomes 630 mW (=100 mW×0.9×7).

Sixth Embodiment

Figure 22:
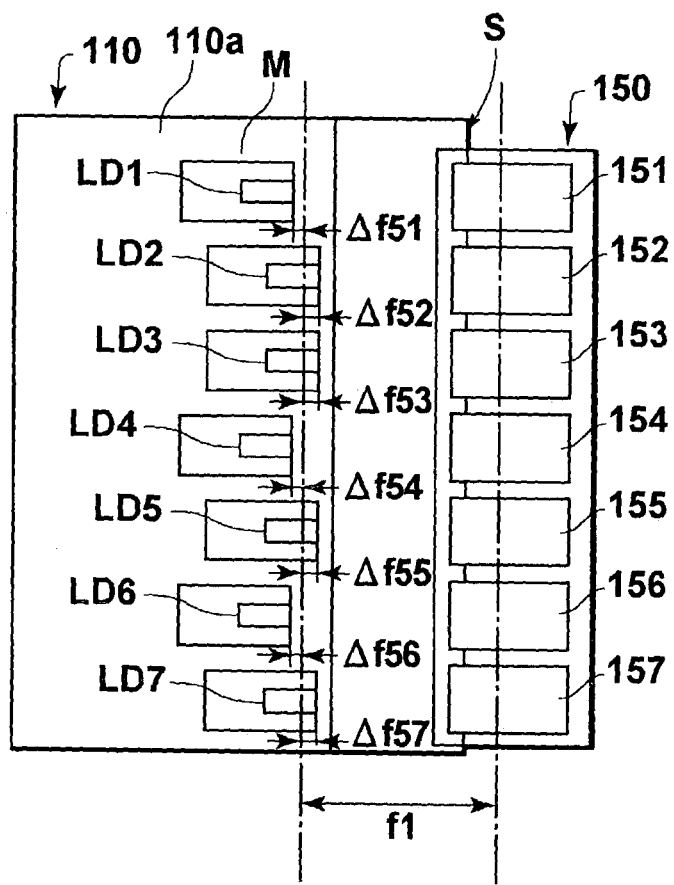
FIG. 22 is a plan view of a laser apparatus according to a sixth embodiment of the present invention.
Figure 23:
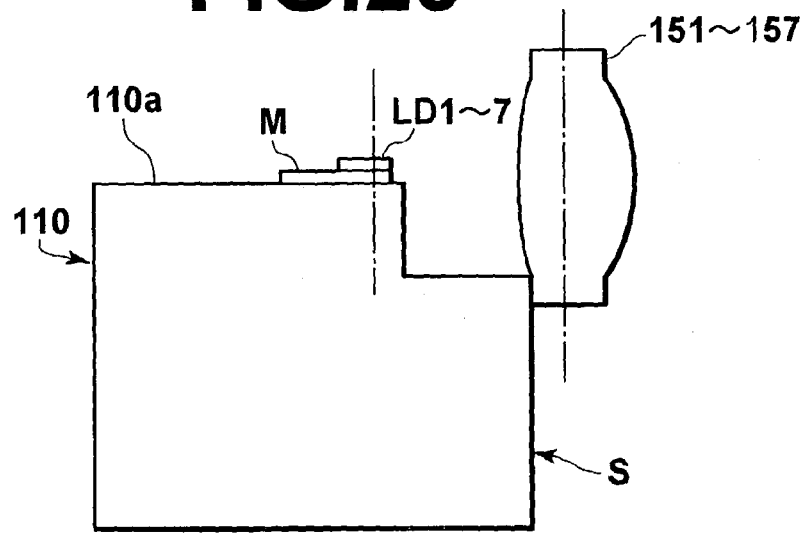
FIG. 23 is a side view of the laser apparatus of FIG. 22.

FIGS. 22 and 23 are plan and side views of a laser apparatus according to the sixth embodiment of the present invention. The laser apparatus according to the sixth embodiment can be used for constructing an optically-multiplexing laser-light source.

The laser apparatus according to the sixth embodiment is basically different from the laser apparatus illustrated in FIGS. 14 and 15 in that a collimator-lens array 150 containing seven lens elements 151 through 157 is used, instead of the seven separately arranged collimator lenses 111 through 117.

Generally, in assembly using a collimator-lens array, it is impossible to finally align the optical axes of the collimated laser beams by adjustment of individual collimator lenses as in the fifth embodiment. Therefore, conventionally, each of the collimator-lens array and an array of laser diodes is designed to have identical dimensions, and mounted by passive alignment. This is the least expensive method, which includes simple assembly steps and requires a small number of man-hours.

In order to realize the passive alignment, it is necessary to accurately form reference surfaces and positioning marks for assembly of the collimator-lens array and the array of laser diodes. However, the accurate formation of the reference surfaces and positioning marks is practically uneasy. Therefore, in a conceivable assembly method, the collimator-lens array and the array of laser diodes are accurately manufactured so that the relative positions between the lens elements and the laser diodes become accurate, and then the position of the collimator-lens array is adjusted and fixed. If the relative positions between the lens elements and the laser diodes are determined, it is possible to combine and optically multiplex the seven laser beams most effectively as a whole. In the adjustment of the collimator-lens array and the array of laser diodes, four-axis alignment including three-axis alignment and rotation around an optical axis is adjusted. However, in order to adjust the rotation around an optical axis, an additional lens holder is necessary, and the process of adjustment of alignment is complicated.

In addition, a concern in the case where the collimator-lens array is made of glass is variations in optical properties among the seven lens elements. Although it is relatively easy to realize nearly tolerable dimensions in the height and pitch directions by using a metal mold, variations in dimensions in the focal direction become about 1 to 3% of the focal length due to weight variations of preforms, contraction caused by aging, and the like. That is, great deviations from designed dimensions occur in the focal direction. When the focal lengths of the lens elements in a collimator-lens array individually vary, it is impossible to mount the collimator-lens array so that all of the seven lens elements are optimumly adjusted with respect to the array of the laser-diode chips which is mounted as designed.

On the other hand, according to the present invention, the focal lengths of the respective lens elements constituting the collimator-lens array are measured in advance, and the laser diodes are arrayed so as to correct the positions of the laser diodes based on the measured focal lengths. Thus, the variations in the arrayed lens elements can be absorbed by the above correction, and the collimator-lens array and the array of the laser-diode chips can be satisfactorily adjusted for focusing. In addition, since the focusing operation is performed at the positions of the laser diodes, it is unnecessary to provide an additional lens holder for adjustment of lens alignment, and the alignment becomes two-axis alignment and rotation around an axis, and is adjusted in a plane. Therefore, the construction of the apparatus becomes simple, and the man-hours are reduced.

In the sixth embodiment, the focal lengths of the lens elements 151 through 157 constituting the collimator-lens array 150 are measured in advance by using a separate measurement system. For example, the measurement results are indicated by deviations $\Delta f51$ through $\Delta f57$ from a designed focal length f1 which is determined with reference to a production reference surface of the collimator-lens array. Each of the laser diodes is junction-side-down mounted on a submount M in advance.

The heat block 110 is formed to have a reference surface S. When the submounts M on which the GaN-based laser-diode chips LD1 through LD7 are mounted are successively placed on the heat block 110 so that the GaN-based laser-diode chips LD1 through LD7 form an array, the production reference surface of the collimator-lens array 150 is placed in contact with the reference surface S, and the positions of the GaN-based laser-diode chips LD1 through LD7 in the direction of the optical axes (i.e., in the direction of the focal length) are determined to be the positions respectively shifted by the above deviations $\Delta f51$ through $\Delta f57$ from the positions corresponding to the designed focal length f1 (=3 mm) which is determined with reference to the reference surface S.

In addition, the positions of the GaN-based laser-diode chips LD1 through LD7 in the direction of the array of the GaN-based laser-diode chips LD1 through LD7 are determined with a designed pitch of 1.1 mm. Since the lens elements 151 through 157 of the collimator-lens array 150 cannot be individually adjusted later, and only the entire collimator-lens array 150 can be adjusted at a later step, the mounted positions of the GaN-based laser-diode chips LD1 through LD7 in the direction of the array of the GaN-based laser-diode chips LD1 through LD7 are required to be highly precise.

After the above determination of the positions of the GaN-based laser-diode chips LD1 through LD7, the submounts M on which the GaN-based laser-diode chips LD1 through LD7 are mounted are fixed to the heat block 110 so that the GaN-based laser-diode chips LD1 through LD7 are located at the positions determined as above.

Although the reference surface S is a surface of the heat block 110 in the sixth embodiment, alternatively, it is possible to use a surface of a separate element as the reference surface S. However, in consideration of precision and cost of parts, it is preferable that the reference surface S is a surface of the heat block 110.

When the collimator-lens array 150 is placed so that the manufacturing reference surface of the collimator-lens array 150 is in contact with the reference surface S of the heat block 110, and rotation around an axis is adjusted, the distances between the lens elements 151 through 157 and the corresponding GaN-based laser-diode chips LD1 through LD7 become the actually measured values f1+$\Delta f51$ through f1+$\Delta f57$ of the focal lengths of the lens elements 151 through 157, respectively, *as illustrated in FIG. 22. Therefore, divergent laser beams B1 through B7 emitted from the GaN-based laser-diode chips LD1 through LD7 are respectively collimated by the lens elements 151 through 157 of the collimator-lens array 150 fixed to the reference surface S of the heat block 110. Thus, it is unnecessary to further adjust the positions of the collimator-lens array 150 in the optical-axis direction, and provide a lens holder for adjustment and fixation of an optical axis.

Next, details of adjustment of the laser beams B1 through B7 emitted from the GaN-based laser-diode chips LD1 through LD7 will be explained below.

It is important that the axes of the laser beams B1 through B7 are parallel to each other. Although these laser beams are collimated, the axes of the collimated laser beams are originally not parallel to each other. Therefore, it is necessary to make the directions of the laser beams parallel by pressing the lens elements 151 through 157 against the reference surface S so as to maintain the distances from the respectively corresponding GaN-based laser-diode chips, and adjusting and fixing the positions of the lens elements 151 through 157 in a plane perpendicular to the laser emission axes O.

Although, at this time, the lens elements 151 through 157 are pressed against the reference surface S, in order to maintain repeatability in the focal direction, it is necessary to produce the collimator-lens array 150 and the heat block 110 so as to limit the surface roughnesses of the bonding surface of the collimator-lens array 150 and the reference surface S to small amounts. It is preferable that the center-line-average roughness Ra is one micrometer or less.

In addition, since the collimator-lens array 150 is greater than each collimator lens in length, it is preferable that the area of the bonding surface the collimator-lens array 150 has a smaller bonding area within a range which can realize sufficient bonding strength, in order to suppress stress caused by difference in heat expansion from the heat block 110 and inclination and displacement of the lens in the focal direction caused by unevenness of the bonding surface. The position of collimator-lens array 150 in the reference surface is adjusted with respect to the GaN-based laser-diode chips LD1 through LD7 so that the seven lens elements 151 through 157 are aligned most effectively as a whole, and fixed to the heat block 110 at the adjusted position. Therefore, each of the GaN-based laser-diode chips LD1 through LD7 and the lens elements 151 through 157 is fixed to the heat block 110 at only one place, and the construction of the alignment system can be simplified. Thus, it is expected that the laser apparatus can be assembled in a small number of man-hours with high reliability.

Further, in the above construction, it is not possible to adjust the positions of the collimator-lens array 150 and the GaN-based laser-diode chips LD1 through LD7 in the vertical direction. Therefore, the positions of the collimator-lens array 150 and the GaN-based laser-diode chips LD1 through LD7 in the vertical direction are adjusted by passive alignment. Therefore, it is necessary to limit the variations in the positions of the collimator-lens array 150 and the GaN-based laser-diode chips LD1 through LD7 in the vertical direction within a tolerable range. It is considered that the junction-side-down mounting is preferable for reducing the variations in the positions of the GaN-based laser-diode chips LD1 through LD7 in the vertical direction.

Furthermore, in the case where the GaN-based laser-diode chips LD1 through LD7 are directly junction-side-down mounted on the heat block 110, and the positions of the GaN-based laser-diode chips LD1 through LD7 in the focal direction are adjusted for the actual focal lengths, the GaN-based laser-diode chips LD1 through LD7 are not necessarily located at an edge of the heat block 110. Therefore, the laser beams can be eclipsed by the heat block 110. However, in the case where the GaN-based laser-diode chips LD1 through LD7 are junction-side-down mounted at edges of the submounts which are mounted on the heat block 110, it is possible to prevent occurrence of an eclipse of the laser beams even when the positions of the GaN-based laser-diode chips LD1 through LD7 in the focal direction are adjusted for the actual focal lengths, since the thicknesses of the submounts are sufficiently greater than the amounts of the position adjustment of the GaN-based laser-diode chips LD1 through LD7.

In the case where the submounts are used as above, in order to suppress variations in the heights of the light-emission points of the GaN-based laser-diode chips LD1 through LD7, the variations in the thicknesses of the submounts are required to be limited within at most a tolerance required for the light-emission points of the GaN-based laser-diode chips LD1 through LD7.

As explained above, in the case where the array of the laser-diode chips are mounted through the submounts, it is possible to prevent occurrence of an eclipse even when the positions of the laser-diode chips are adjusted for the focal lengths, and suppress variations in the heights of the light-emission points by junction-side-down mounting on the submounts in which the thickness variations are suppressed.

Eclipse

Figure 24A:
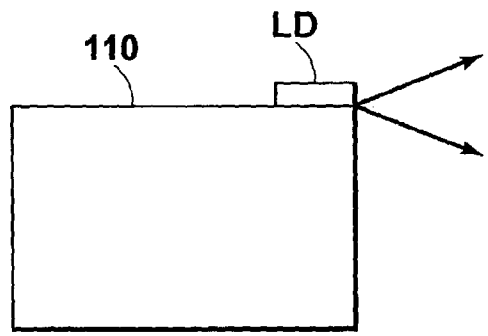
FIGS. 24A through 24D are diagrams for explaining an eclipse of a laser beam caused by a structure in which a laser element is mounted.
Figure 24B:
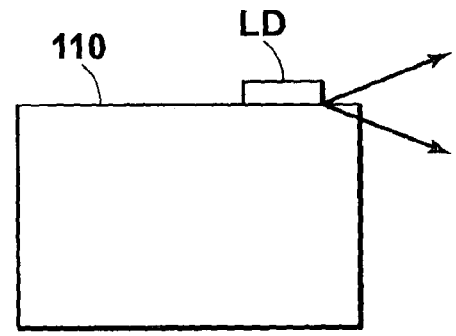
Figure 24C:
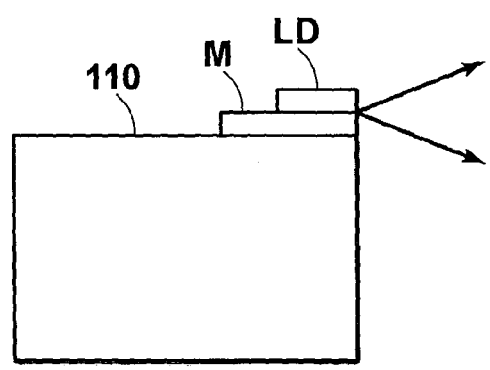
Figure 24D:
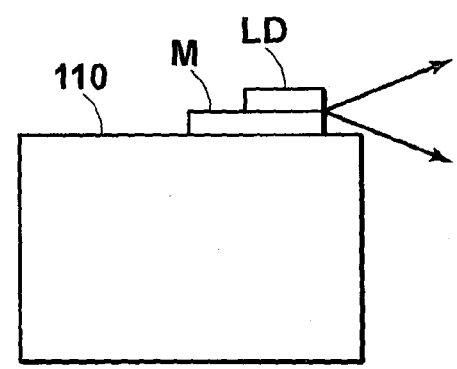

FIGS. 24A through 24D are diagrams for explaining an eclipse of a laser beam. In FIGS. 24A and 24B, a laser diode LD is directly fixed to a heat block 110. In FIGS. 24C and 24D, a laser diode LD is directly fixed to a heat block 110 through a submount. In the cases of FIGS. 24A and 24B, an eclipse may or may not occur depending on the mounted position of the laser diode LD when the mounted position is adjusted for a focal length. On the other hand, in the cases of FIGS. 24C and 24D, an eclipse does not occur even when the mounted position is greatly shifted for adjustment for a focal length.

In the case of junction-side-up mounting, a visible feature indicating a light-emission point (e.g., a ridge) is visible from above. However, in the case of junction-side-down mounting, the visible feature indicating a light-emission point is not visible from above. Therefore, conventionally, in the case of junction-side-down mounting, in order to recognize the position of the light-emission point, the chip is viewed from below by using an inverted optical system.

Nevertheless, conventionally, in the case where a laser diode LD is junction-side-down mounted on a submount, the visible feature cannot be viewed from below due to the existence of the submount. That is, the positioning information for use in mounting cannot be viewed from either above or below.

The above problem can be solved by the following structures for mounting a laser element on a submount.

Figure 25A:
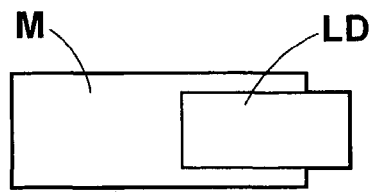
FIGS. 25A through 25C are plan, side, and bottom views illustrating outlines of a first example of a structure in which a laser element is mounted on a submount.
Figure 25B:
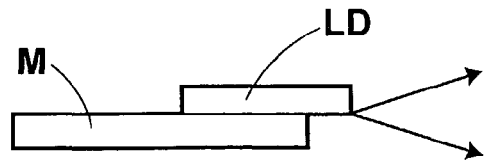
Figure 25C:
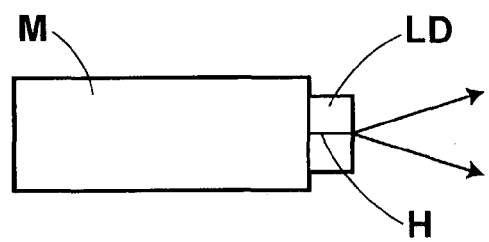

FIGS. 25A through 25C are plan, side, and bottom views illustrating outlines of a first example of a structure in which a laser diode LD is mounted on a submount M. In the first example, a laser-diode chip LD is mounted on a submount M so that a portion of the laser-diode chip LD protrudes from an end of the submount, and a visible feature H (such as a ridge) indicating a light-emission point is visible from below. Thus, even when the laser-diode chip LD is junction-side-down mounted on the submount M, the position of the laser-diode chip LD can be easily recognized from below.

Figure 26A:
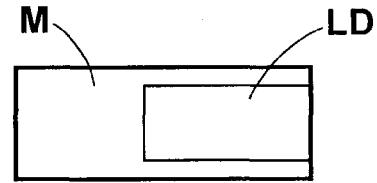
FIGS. 26A through 26C are plan, side, and bottom views illustrating outlines of a second example of a structure in which a laser element is mounted on a submount.
Figure 26B:
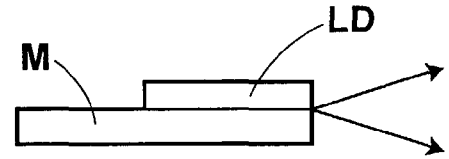
Figure 26C:
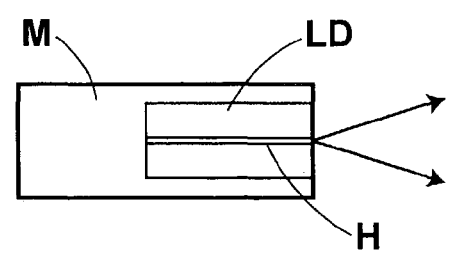

FIGS. 26A through 26C are plan, side, and bottom views illustrating outlines of a second example of a structure in which a laser element is mounted on a submount M. In the second example, the submount M is made of a material (such as Si) which is transparent to visible light or infrared light. Thus, a visible feature H (such as a ridge) indicating a light-emission point is visible from below.

Figure 27A:
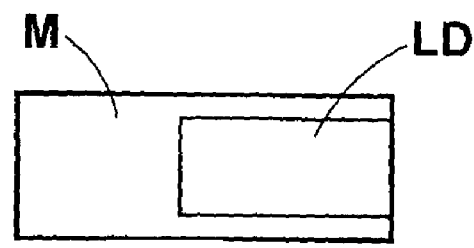
FIGS. 27A through 27C are plan, side, and bottom views illustrating outlines of a third example of a structure in which a laser element is mounted on a submount.
Figure 27B:
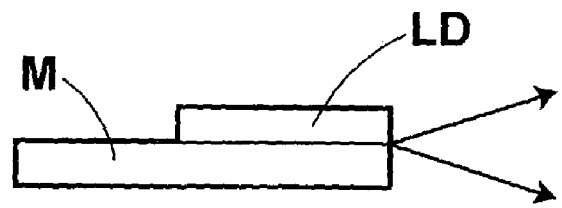
Figure 27C:
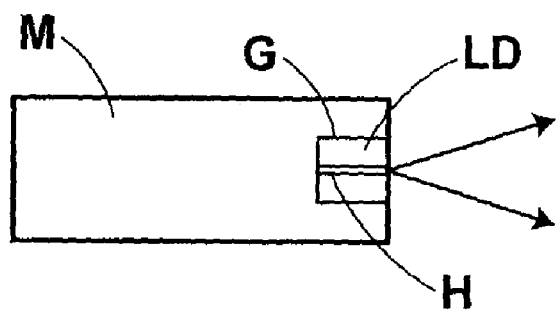

FIGS. 27A through 27C are plan, side, and bottom views illustrating outlines of a third example of a structure in which a laser element is mounted on a submount. In the third example, the submount M has an aperture G such as a notch or a hole so that a visible feature H (such as a ridge) indicating a light-emission point is visible from below. The aperture G may have any shape, e.g., a rectangular or round shape. In addition, it is preferable that the aperture G is located as near as possible to a light emission portion of the laser diode LD.

In addition to the measurement of the focal lengths of the collimator lenses, pitch information is also obtained in advance by measurement of intervals at which the lens elements are arranged. For example, when deviations from the designed pitch of 1.1 mm are indicated as Dp51 through Dp57, the positions of the GaN-based laser-diode chips LD1 through LD7 in the pitch direction (i.e., the direction in which the GaN-based laser-diode chips LD1 through LD7 are arranged) are determined in consideration of the deviations Dp51 through Dp57 Therefore, even when actual dimensions of the collimator-lens array are deviated from designed dimensions in the focal and pitch directions, it is possible to adjust the relative positions between the array of the laser-diode chips and the collimator-lens array by correcting the positions of the laser-diode chips during the step of mounting the laser-diode chips based on the measurement data which are obtained in advance.

Seventh Embodiment

Figure 28:
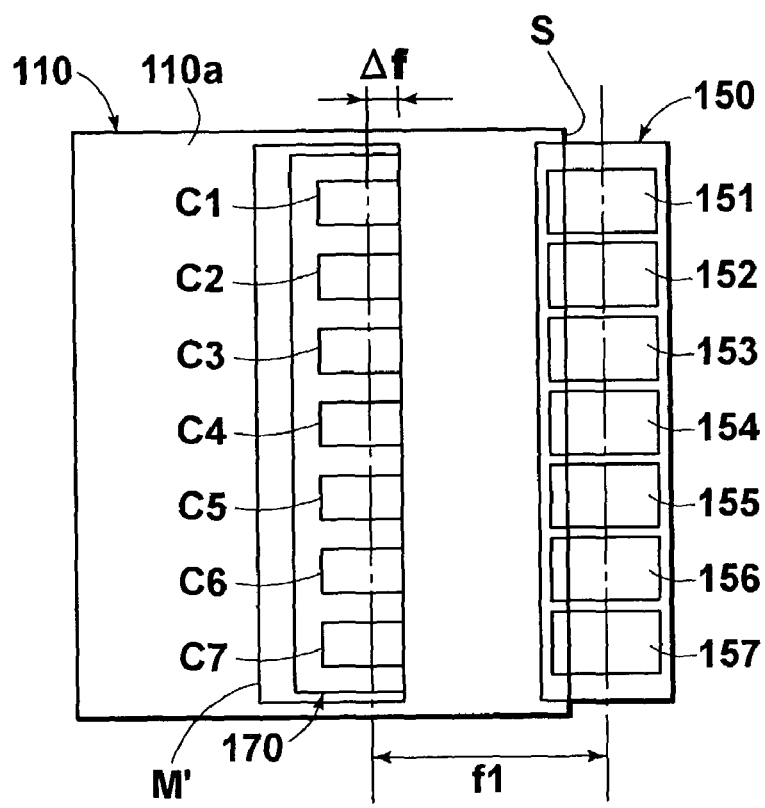
FIG. 28 is a plan view of a laser apparatus according to a seventh embodiment of the present invention.
Figure 29:
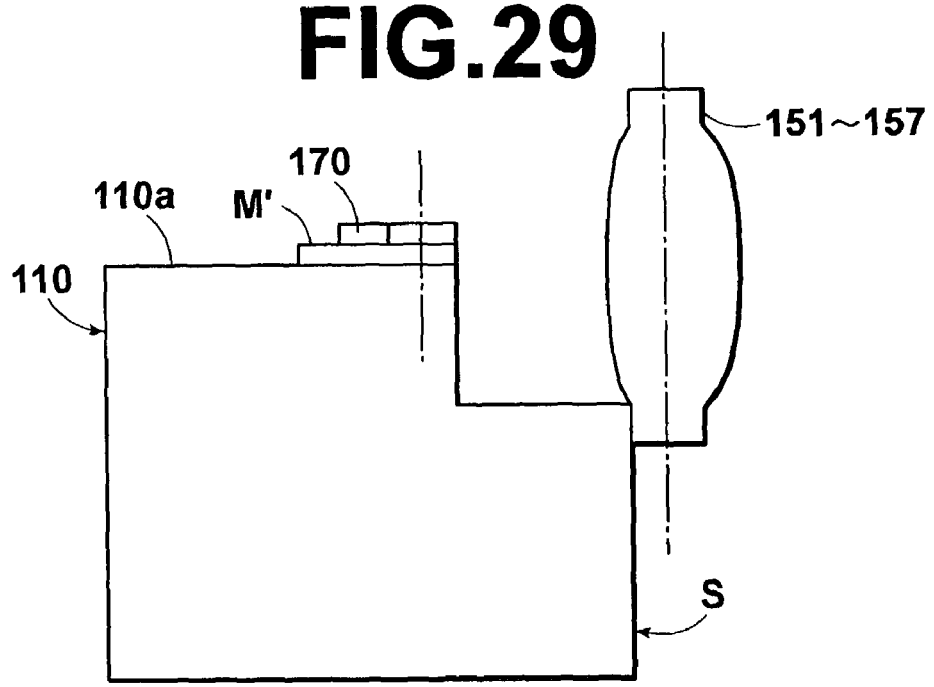
FIG. 29 is a side view of the laser apparatus of FIG. 28.

FIGS. 28 and 29 are plan and side views of a laser apparatus according to the seventh embodiment of the present invention. The laser apparatus according to the seventh embodiment can be used for constructing an optically-multiplexing laser-light source.

The laser apparatus according to the seventh embodiment is basically different from the laser apparatus illustrated in FIGS. 22 and 23 in that a multicavity diode (MCD) 170 containing seven light-emission portions C1 through C7 is used instead of the seven GaN-based laser-diode chips LD1 through LD7 which are separately formed.

In assembly of the collimator-lens array 150 and the multicavity laser diode 170, it is impossible to finally align the optical axes of the collimated laser beams by adjustment of individual collimator lenses as in the fifth embodiment. Therefore, normally, each of the collimator-lens array 150 and the multicavity laser diode 170 is designed to have identical dimensions, and mounted by passive alignment. This is the least expensive method, which includes simple assembly steps and requires a small number of man-hours.

In order to realize the passive alignment, it is necessary to accurately form reference surfaces and positioning marks for assembly of the collimator-lens array 150 and the multicavity laser diode 170. However, the accurate formation of the reference surfaces and positioning marks is practically uneasy. Therefore, in a conceivable assembly method, the collimator-lens array 150 and the multicavity laser diode 170 are accurately manufactured so that the relative positions between the lens elements and the laser diode elements become accurate, and then the positions of the collimator-lens array 150 and the multicavity laser diode 170 are adjusted and fixed. When the relative positions between the lens elements and the laser diodes are determined, it is possible to combine and optically multiplex the seven laser beams most effectively as a whole. In the alignment of the collimator-lens array 150 and the multicavity laser diode 170, four-axis alignment including three-axis alignment and rotation around an optical axis is adjusted. However, in order to adjust the rotation around an optical axis, an additional lens holder is necessary, and the process of adjustment of alignment is complicated.

In addition, a concern in the case where the collimator-lens array is made of glass is variations in optical properties among the seven lens elements. Although it is relatively easy to realize nearly tolerable dimensions in the height and pitch directions by using a metal mold, variations in dimensions in the focal direction become about 1 to 3% of the focal length due to weight variations of preforms, contraction caused by aging, and the like. When the focal lengths of the seven lens elements constituting the single collimator-lens array vary, it is impossible to optimumly adjust all of the lens elements for the multicavity laser diode which is produced almost exactly (with the accuracy of lithography) as designed. Therefore, it is necessary to produce the collimator-lens array 150 with small variations. Further, the variations in the focal lengths of the respective lens elements can be corrected based on similar consideration to the fifth and sixth embodiments explained before.

In the seventh embodiment, the focal lengths of the respective lens elements constituting the collimator-lens array 150 are measured in advance, and an average of the measured focal lengths is obtained. Then, the multicavity laser diode 170 is mounted on the heat block 110 at a position corrected for a deviation Δf of the average of the measured focal lengths from a designed focal length f1. In this case, the focusing operation between the collimator-lens array 150 and the multicavity laser diode 170 can be satisfactorily completed by only placing the collimator-lens array 150 in contact with the reference surface S of the heat block 110. In addition, since the adjustment for focusing is performed at the position at which the multicavity laser diode 170 is mounted on the heat block 110, it is unnecessary to provide an additional lens holder for adjustment of lens alignment, and the alignment becomes two-axis alignment and rotation around an axis, and is adjusted in a plane. Therefore, the construction of the apparatus becomes simple, and the man-hours are reduced.

Details of the above adjustment for focusing are explained below.

The focal lengths of the lens elements 151 through 157 constituting the collimator-lens array 150 are measured in advance by using a separate measurement system, and an average of the measured focal lengths is obtained. For example, the average of the measured focal lengths is indicated by a deviation Δf of the average of the measured focal lengths from a designed focal length f1 which is determined with reference to a production reference surface of the collimator-lens array. The multicavity laser diode 170 is junction-side-down mounted on a submount M' in advance.

The heat block 110 is formed to have a reference surface S. When the submount M' on which the multicavity laser diode 170 is mounted is mounted on the heat block 110, the collimator-lens array 150 is placed so that the production reference surface of the collimator-lens array 150 is in contact with the reference surface S, and the position of the multicavity laser diode 170 in the direction of the optical axes (i.e., in the direction of the focal length) is determined to be the position shifted by the above deviation Δf from the position corresponding to the designed focal length f1 (=3 mm) which is determined with reference to the reference surface S.

Since the multicavity laser diode 170 in which the seven light-emission portions C1 through C7 are arranged in the pitch direction with a designed pitch of 1.1 mm is used, and the entire multicavity laser diode 170 can be adjusted at a later step, high precision is not required in the positioning of the multicavity laser diode 170 in the pitch direction, while high precision is required in the positioning of the array of separate laser diodes.

After the above determination of the position, the sub-mount M' on which the multicavity laser diode 170 is mounted is fixed to the heat block 110 so that the multicavity laser diode 170 is located at the determined position.

Although the seven laser beams are optically multiplexed in the fifth through seventh embodiments, the number of the laser beams optically multiplexed may not be seven, and may be any number greater than one.

Eighth Embodiment

Figure 30:
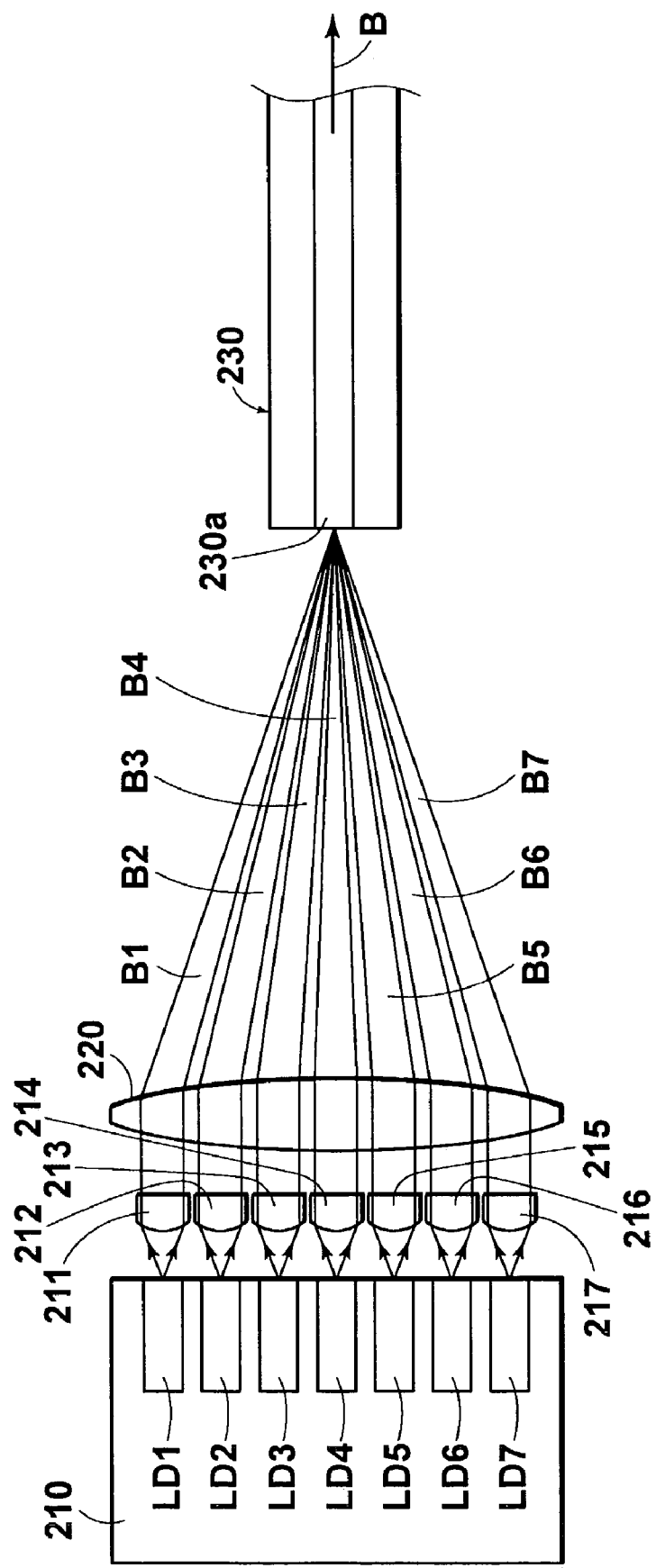
FIG. 30 is a plan view of a portion of a fiber module according to an eighth embodiment of the present invention.
Figure 31:
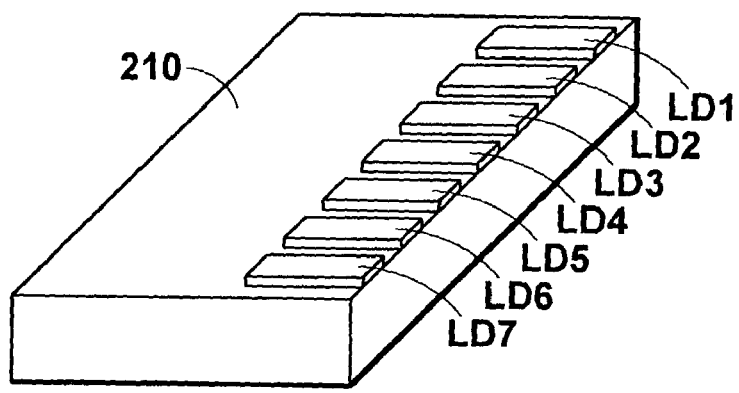
FIG. 31 is a perspective view of a portion of the fiber module of FIG. 30, where the portion contains laser diodes.

FIG. 30 is a magnified plan view of a portion of a high-intensity ultraviolet-light optically-multiplexing fiber module according to the eighth embodiment of the present invention, FIG. 31 is a magnified perspective view of a portion contains laser diodes of the fiber module of FIG. 30, and FIGS. 32, 33, and 34 are plan, side, and front views of the entire fiber module according to the eighth embodiment. The fiber module according to the eighth embodiment realizes an optically-multiplexing laser-light source.

As illustrated in FIG. 30, the fiber module according to the eighth embodiment comprises GaN-based laser-diode chips LD1 through LD7, collimator lenses 211 through 217, a condensing lens 220, and a multimode optical fiber 230. For example, each of the GaN-based laser-diode chips LD1 through LD7 operates in multiple transverse modes. The GaN-based laser-diode chips LD1 through LD7 are fixed on a heat block 210 made of copper. The collimator lenses 211 through 217 are respectively arranged in correspondence with the GaN-based laser-diode chips LD1 through LD7.

In FIG. 30, the shapes of the collimator lenses 211 through 217 and the condensing lens 220 are diagrammatically shown, and details of the mounting of the collimator lenses 211 through 217 and the condensing lens 220 are explained later. In addition, the arrangement of the GaN-based laser-diode chips LD1 through LD7 mounted on the heat block 210 is shown in FIG. 31.

The GaN-based laser-diode chips LD1 through LD7 each have an identical oscillation wavelength of 405 nm and an identical maximum output power of 100 mW. Divergent laser beams B1 through B7 emitted from the GaN-based laser-diode chips LD1 through LD7 are respectively collimated by the collimator lenses 211 through 217. Then, the collimated laser beams B1 through B7 are collected by the condensing lens 220, and converge on a light-entrance end face of the core 230a of the multimode optical fiber 230. In this example, an optical condensing system is constituted by the collimator lenses 211 through 217 and the condensing lens 220, and an optical multiplex system is constituted by the optical condensing system and the multimode optical fiber 230. Thus, the laser beams B1 through B7 collected by the condensing lens 220 as above enter and propagate in the core 230a of the multimode optical fiber 230, in which the laser beams B1 through B7 are optically multiplexed into a single laser beam B. Then, the laser beam B is output from the multimode optical fiber 230. The multimode optical fiber 230 may be a step-index type, a graded-index type, or any combination thereof.

Figure 32:
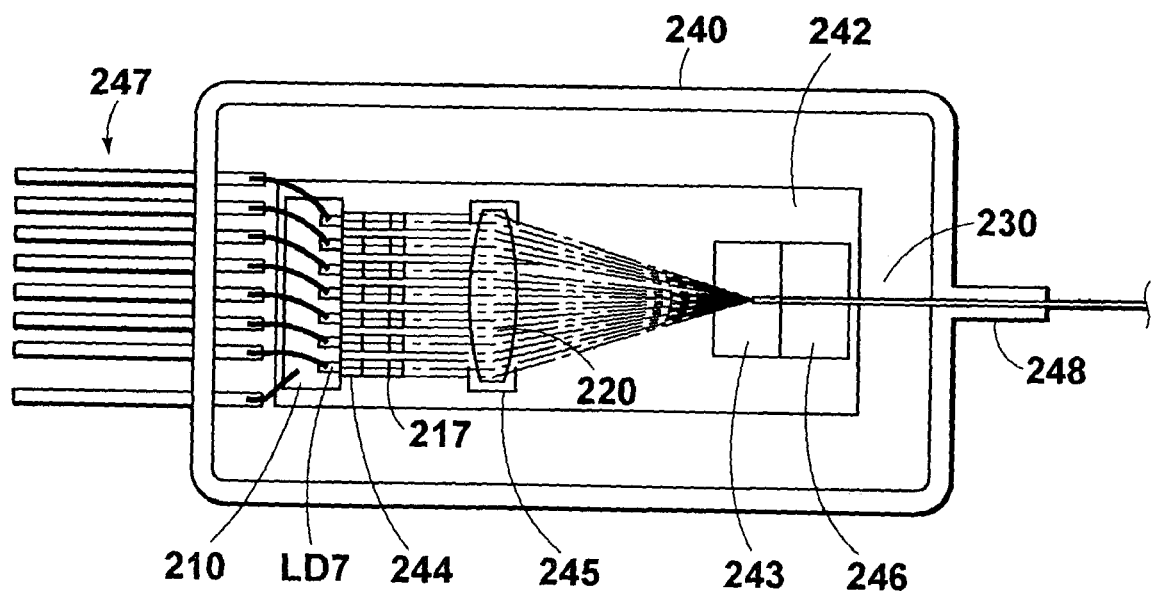
FIG. 32 is a plan view of the entire fiber module of FIG. 30.
Figure 33:
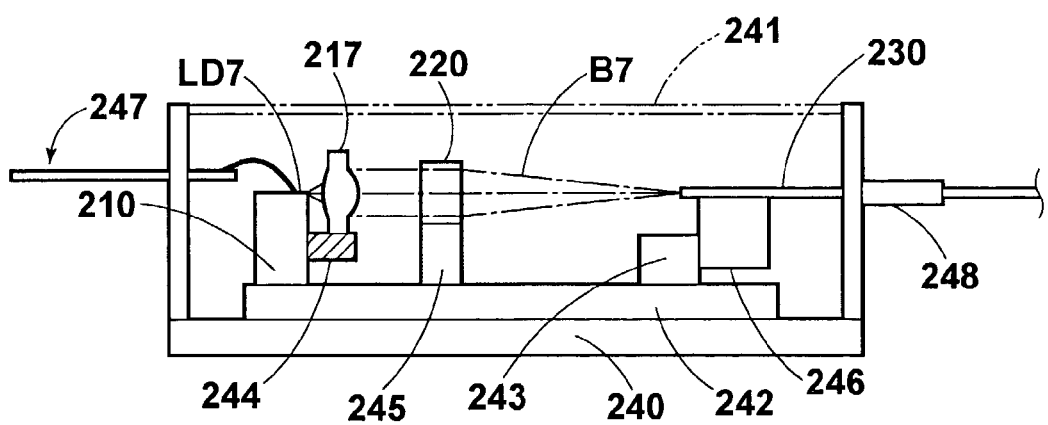
FIG. 33 is a side view of the fiber module of FIG. 30.

Next, the fiber module according to the eighth embodiment is explained in detail with reference to FIGS. 32, 33, and 34, in which details of the shapes and the mounting of the collimator lenses 211 through 217 and the condensing lens 220 are shown. In FIGS. 32 and 33, in order to simplify the illustration, the reference numbers of the GaN-based laser-diode chips LD1 through LD6 and the collimator lenses 211 through 216 are not shown.

In this example, the optical elements constituting the high-intensity ultraviolet-light optically-multiplexing fiber module are contained in a box type package 240, which has an opening on the upside. By closing the opening with a cover 241, the high-intensity ultraviolet-light optically-multiplexing fiber module is hermetically sealed and held within the closed space realized by the package 240 and the cover 241.

A base plate 242 is fixed on the inner bottom surface of the package 240, the aforementioned heat block 210 is fixed on the upper surface of the base plate 242, and a collimator-lens holder 244 for holding the collimator lenses 211 through 217 is fixed to the heat block 210. In addition, a condensing-lens holder 245 and a fiber block 243 are fixed to the base plate 242, and a fiber holder 246 is fixed to the fiber block 243. The condensing-lens holder 245 holds the condensing lens 220, and the fiber holder 246 holds a light-entrance end portion of the multimode optical fiber 230. Further, wirings 247 for supplying driving currents to the GaN-based laser-diode chips LD1 through LD7 are led out of the package 240 through openings formed in a sidewall of the package 240.

Figure 34:
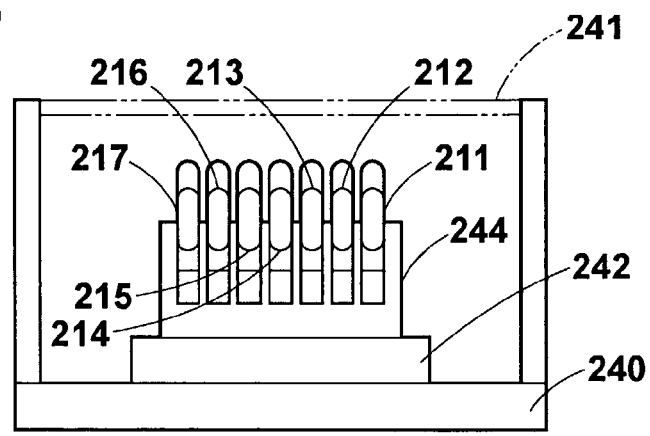
FIG. 34 is a front view of a portion of the fiber module of FIG. 30.
Figure 35A:
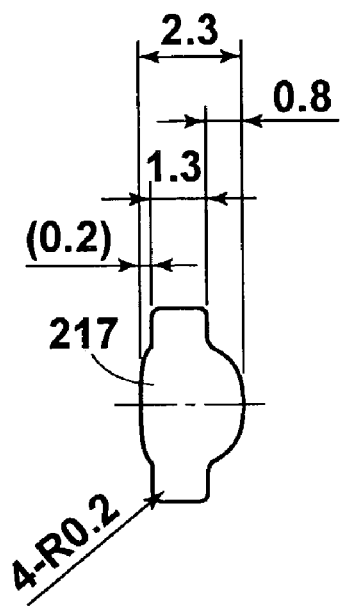
FIG. 35A is a side view of one of the collimator lenses used in the fiber module of FIG. 30.
Figure 35B:
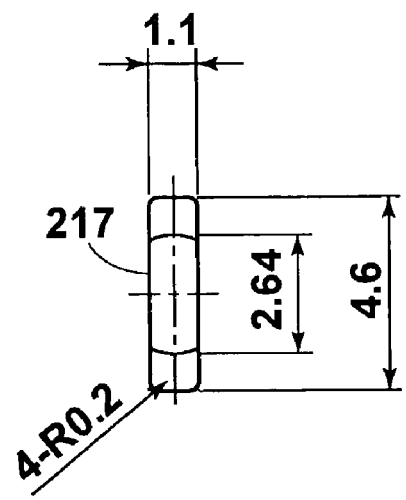
FIG. 35B is a front view of the collimator lens of FIG. 35A.

As illustrated in FIG. 34, each of the collimator lenses 211 through 217 has an elongated shape which is obtained by cutting an aspherical round lens so as to leave a portion containing the optical axis of the aspherical round lens. For example, the collimator lenses 211 through 217 can be formed by molding from resin or optical glass. FIGS. 35A and 35B are magnified, side and front views of the collimator lens 217 as a representative of the collimator lenses 211 through 217 used in the optically-multiplexing fiber module of FIG. 32. In addition, examples of dimensions (in millimeters) of the essential portions are also indicated in FIGS. 35A and 35B.

The collimator lenses 211 through 217 illustrated in FIGS. 34, 35A, and 35B each have an aperture which has a first diameter parallel to the direction in which light emission points of the GaN-based laser-diode chips LD1 through LD7 are aligned (i.e., the horizontal direction in FIG. 34) and a second diameter in the direction (i.e., the vertical direction in FIG. 34) perpendicular to the first diameter and greater than the first diameter. The collimator lenses 211 through 217 are arranged close to each other in the direction in which light emission points of the GaN-based laser-diode chips LD1 through LD7 are aligned.

For example, each of the GaN-based laser-diode chips LD1 through LD7 has an emission width of 2 micrometers, a spread angle of 10° in the minor axis direction parallel to the active layer of the GaN-based laser-diode chip and a spread angle of 30° in the major axis direction perpendicular to the active layer. In addition, the light emission points of the GaN-based laser-diode chips LD1 through LD7 are arranged along a line parallel to the active layers of the GaN-based laser-diode chips LD1 through LD7.

The laser beams B1 through B7 respectively enter the collimator lenses 211 through 217 in such a manner that the direction in which the spread angle of each of the laser beams B1 through B7 is maximized coincides with the direction of the greater diameter of the elongated aperture of each of the collimator lenses 211 through 217, and the direction in which the spread angle of each of the laser beams B1 through B7 is minimized coincides with the direction of the smaller diameter of the elongated aperture of each of the collimator lenses 211 through 217. Since the elliptic cross sections of the incident laser beams B1 through B7 fit well with the elongated shapes of the collimator lenses 211 through 217, it is possible to minimize portions of the apertures of the collimator lenses 211 through 217 which are not effectively used. In other words, the collimator lenses 211 through 217 can be efficiently used.

Specifically, in the eighth embodiment, the aperture diameters of each of the collimator lenses 211 through 217 in the horizontal and vertical directions are respectively 1.1 mm and 4.6 mm, and the beam diameters of each of the incident laser beams B1 through B7 in the horizontal and vertical directions are respectively 0.9 mm and 2.6 mm. In addition, the collimator lenses 211 through 217 each have a focal length f1 of 3 mm and a numerical aperture (NA) of 0.6, and are arranged with a lens pitch of 1.25 mm.

Figure 36A:
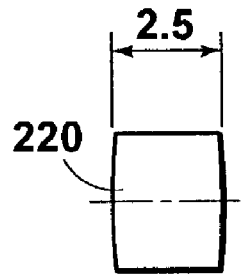
FIG. 36A is a side view of a condensing lens used in the fiber module of FIG. 30.
Figure 36B:
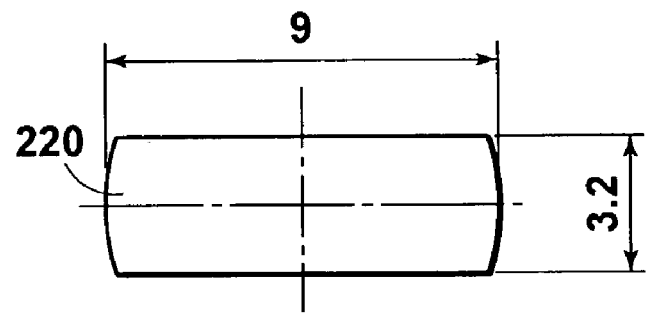
FIG. 36B is a front view of the condensing lens of FIG. 36A.

FIGS. 36A and 36B are magnified side and front views of the condensing lens 220. In addition, examples of dimensions (in millimeters) of the essential portions are also indicated in FIGS. 36A and 36B. As illustrated in FIGS. 36A and 36B, the condensing lens 220 also has an elongated shape which is obtained by cutting an aspherical round lens so as to leave a portion containing the optical axis of the aspherical round lens. The condensing lens 220 is elongated in a horizontal direction along which the collimator lenses 211 through 217 are arranged, and is short in the vertical direction. In this example, the condensing lens 220 has a focal length f2 of 12.5 mm and a numerical aperture (NA) of 0.3. For example, the condensing lens 220 can also be formed by molding from resin or optical glass.

The multimode optical fiber 230 is formed by using as a base the graded-index type optical fiber manufactured by Mitsubishi Cable Industries, Ltd. The multimode optical fiber 230 has a core diameter of 25 micrometers and a numerical aperture (NA) of 0.3, and the transmittance of the end face coating is 99.5% or greater. In this example, the core diameter multiplied by the NA is 7.5 micrometers.

In the construction of the eighth embodiment, the coupling efficiency of the laser beams B1 through B7 to the multimode optical fiber 230 is 0.9. Therefore, when the output power of each of the GaN-based laser-diode chips LD1 through LD7 is 100 mW, the output power of the optically multiplexed laser beam B becomes 630 mW (=100 mW×0.9×7).

Next, a structure for fixation of the multimode optical fiber 230 is explained below with reference to FIGS. 32 and 33. The fiber block 243 is made of transparent glass, and bonded to the base plate 242 with an ultraviolet-light-curing type adhesive. The fiber holder 246*is* also made of transparent glass, and bonded to the fiber block 243 with an ultraviolet-light-curing type adhesive. Further, the light-entrance end portion of the multimode optical fiber 230 is bonded to the upper surface of the fiber holder 246 with an ultraviolet-light-curing type adhesive. Furthermore, the multimode optical fiber 230 has a metal ferrule (not shown) a fiber sealing portion 248 is formed in a sidewall of the package 240, and the metal ferrule of the multimode optical fiber 230 is fixed to the fiber sealing portion 248 with a brazing material.

The upper surface of the fiber holder 246 is smoothed into a highly flat surface, so that the multimode optical fiber 230 can be bonded to the upper surface of the fiber holder 246 with an ultraviolet-light-curing type adhesive having a form of a thin film with a thickness not greater than one micrometer. If the upper surface of the fiber holder 246 is greatly uneven, it is impossible to make such a thin film of the ultraviolet-light-curing type adhesive.

In addition, surfaces of the fiber block 243 which are to be fixed to the base plate 242 and the fiber holder 246 and a surface of the fiber holder 246 to be fixed to the fiber block 243 are also smoothed into highly flat surfaces, so that the fiber block 243 can be bonded to both of the fiber holder 246 and the base plate 242 with an ultraviolet-light-curing type adhesive having a form of a thin film with a thickness not greater than one micrometer.

When the base plate 242, the fiber block 243, the fiber holder 246', and the multimode optical fiber 230 are bonded to each other with an ultraviolet-light-curing type adhesive having a form of a thin film with a thickness not greater than one micrometer as explained above, it is possible to limit expansion or contraction of the ultraviolet-light-curing type adhesive due to temperature change to a small amount, and achieve sufficient precision of fixation. In the eighth embodiment, the coupling efficiency of the optically multiplexed laser beams B to the multimode optical fiber 230 is 90% or higher.

Further, since the fiber block 243 and the fiber holder 246 for holding the multimode optical fiber 230 are made of transparent glass, it is possible to prevent the fiber block 243 and the fiber holder 246 from blocking off ultraviolet light when the ultraviolet-light-curing type adhesives are irradiated with the ultraviolet light for curing. Therefore, it is possible to arbitrarily set the direction of the irradiation of the ultraviolet light, and realize satisfactory workability.

Ninth Embodiment

Figure 37:
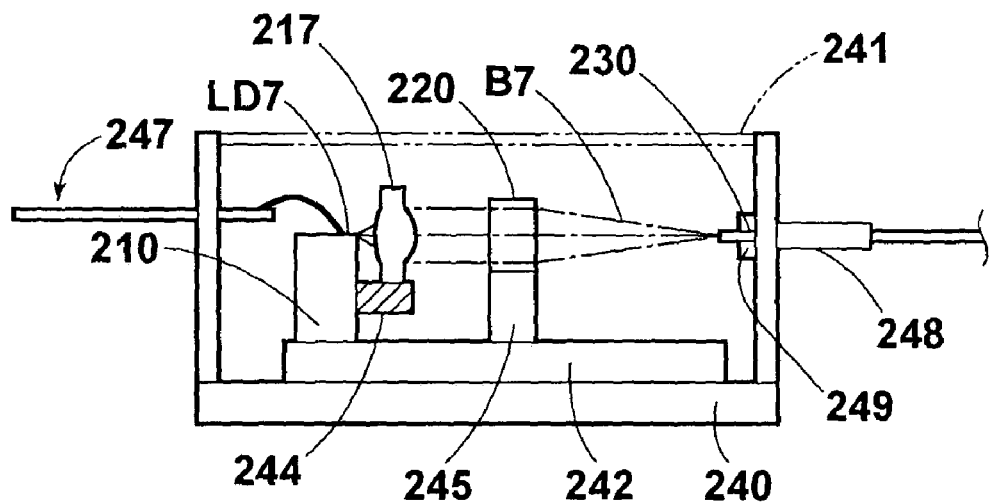
FIG. 37 is a side view of a fiber module according to a ninth embodiment of the present invention.
Figure 38:
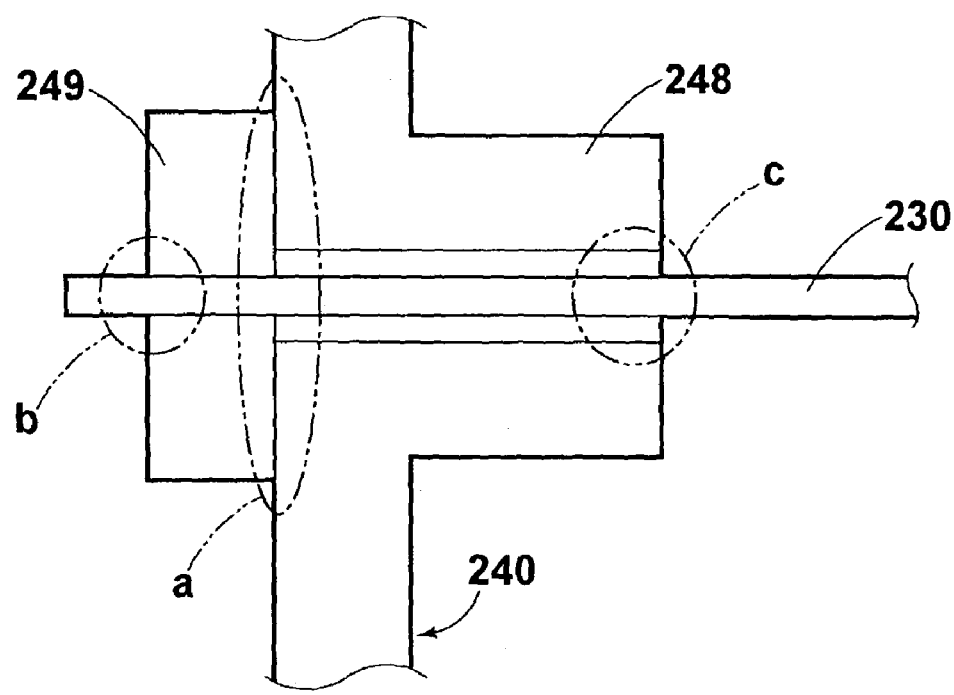
FIG. 38 is a magnified cross-sectional view of a portion of the fiber module of FIG. 37.

FIG. 37 is a side view of a fiber module according to the ninth embodiment of the present invention, and FIG. 38 is a magnified cross-sectional view of a portion of the fiber module of FIG. 37. The fiber module according to the ninth embodiment realizes an optically-multiplexing laser-light source.

The fiber module according to the ninth embodiment is different from the eighth embodiment in that the fiber block 243 and the fiber sealing portion 248 used in the eighth embodiment are dispensed with, and the multimode optical fiber 230 is fixed to a sidewall of the package 240 by using a fiber bracket 249 which is fixed to the inner surface of the sidewall.

In the ninth embodiment, a surface of the fiber bracket 249 to be fixed to the package 240 and the sidewall of the package 240 to which the fiber bracket 249 is to be fixed are each smoothed into a highly flat surface. Thus, the fiber bracket 249 is fixed to the package 240, and the multimode optical fiber 230 is fixed to the fiber bracket 249, with an ultraviolet-light-curing type adhesive having a form of a thin film with a thickness not greater than one micrometer.

In FIG. 38, an area of the inner surface of the package 240 to which the fiber bracket 249 is bonded is indicated by the reference a, areas of the fiber bracket 249 to which the multimode optical fiber 230 is bonded are indicated by the reference b, and areas of the fiber sealing portion 248 to which the multimode optical fiber 230 is fixed with a brazing material are indicated by the reference c.

Since the multimode optical fiber 230 is bonded to the fiber bracket 249 with the ultraviolet-light-curing type adhesive having a form of a thin film with a thickness not greater than one micrometer as explained above, it is possible to limit expansion and contraction of the ultraviolet-light-curing type adhesive due to temperature change to a small amount, and achieve sufficient precision of fixation.

Since the multimode optical fiber 230 is bonded to the fiber bracket 249 which is fixed to the inner surface of a sidewall of the package 240 in the ninth embodiment, the fiber block 243 and the fiber holder 246 used in the eighth embodiment can be dispensed with. Therefore, it is possible to form the entire fiber module with small size and light weight.

Next, a step of bonding glass members (e.g., the fiber block 243 and the fiber holder 246) together with an ultraviolet-light-curing type adhesive will be explained below.

First, a surface of a first glass member is mirror finished, and unevenness of 0.15 micrometers or greater is produced on a surface of a second glass member by using an abrasive. Then, the surfaces of the first and second glass members are placed in contact with each other, and pressed against each other with a load of tens of grams so that the thickness of the adhesive becomes about 0.3 micrometers. In this case, when the above surface of the second glass member is formed to have a maximum peak-to-valley height (Rmax) of about 0.3 micrometers, it is possible to make the thickness of the adhesive about 0.3 micrometers.

Specifically, when the fiber holder 246 is bonded to the fiber block 243, the surface of the fiber holder 246 is ground so that the unevenness of the surface of the fiber holder 246 produces a gap between the fiber block 243 and the fiber holder 246. In addition, when the fiber block 243 is bonded to the base plate 242, the surface of the base plate 242 is machined so as to leave traces of the machining. Further, the surface of the fiber bracket 249 is also ground.

It is preferable that the ultraviolet-light-curing type adhesive is a type which does not outgas. In this case, it is possible to prevent deterioration of the optical elements within the package 240 caused by the outgas, and increase the lifetime of the fiber module.

Variations (i) The present invention can be used in applications in which the collimated laser beams are not collected. Even in such applications, the advantages of the present invention are not lost.

(ii) The applications of the present invention are not limited to constructions in which a plurality of laser beams are optically multiplexed into a single laser beam by using an optical fiber. For example, the laser apparatuses according to the present invention can be used in a structure in which each of the plurality of laser beams is collected and converged on one of modulation portions constituting a spatial light modulation element and being one-dimensionally arranged, so that each of the plurality of laser beams is individually modulated. For example, such a spatial light modulation element may be a linear liquid-crystal spatial modulation element, a DMD (digital mirror device), or a GLV (grating light valve)

(iii) It is possible to integrally form the collimator lenses and the corresponding condensing lens so that the integrally formed lens has both of the collimating and condensing functions.

(iv) The laser diodes used in the present invention are not limited to the GaN-based laser diodes, and may be made of other materials.

(v) Although the fiber modules explained above realize optically-multiplexing laser-light sources, the fiber module according to the present invention is not limited to the optically-multiplexing laser-light sources, and includes any fiber modules in which light is collected and injected into an optical fiber. Such fiber modules also have the aforementioned advantages of the fiber modules according to the explained embodiments.

(vi) In addition, all of the contents of the Japanese patent applications Nos. 2002-201902, 2002-201905, and 2002-201906 are incorporated into this specification by reference.

What is claimed is:

1. A laser apparatus comprising:
a block;
a plurality of laser diodes respectively having light-emission points and being fixed to said block so that the light-emission points are aligned along a direction; and
a collimator-lens array integrally formed to contain a plurality of collimator lenses which are arranged along a direction and respectively collimate laser beams emitted from said plurality of laser diodes;
wherein said block has a lens-setting surface which is flat, perpendicular to optical axes of said plurality of laser diodes, and located on a forward side of said plurality of laser diodes at a predetermined distance greater than zero along said optical axes from said light-emission points, and said collimator-lens array is fixed to said block so that an area of an end surface of said collimator-lens array is in contact with and overlaps an area of said lens-setting surface at only outer sides of said block with respect to a widthwise direction of said block,
wherein each of said plurality of laser diodes is realized by a nitride-based compound laser-diode chip,
wherein said block is a heat-dissipation block made of copper or copper alloy,
wherein said laser apparatus further comprises a plurality of submounts which are made of a material having a thermal expansion coefficient of 3.5 to 6.0×10–6/° C., have a thickness of 200 to 400 micrometers, and are separately formed on said heat-dissipation block,
wherein each of said plurality of laser diodes and said plurality of submounts has a bonding surface, and
wherein each of said plurality of laser diodes is junction-side-down mounted on one of said plurality of submounts in such a manner that the bonding surface of said each of the plurality of laser diodes is bonded to the bonding surface of said one of the plurality of submounts through a metalization layer and an Au-Sn eutectic solder layer each of which is divided into a plurality of areas.

2. A laser apparatus according to claim 1, wherein said lens-setting surface has a flatness not greater than 0.5 micrometers.

3. A laser apparatus according to claim 1, wherein said block has a laser fixation surface on which said plurality of laser diodes are fixed, and the laser fixation surface has a flatness not greater than 0.5 micrometers.

4. A laser apparatus according to claim 1, wherein said plurality of laser diodes are realized by a multicavity laser-diode chip having a plurality of light-emission points.

5. A laser apparatus according to claim 1, wherein said plurality of laser diodes are realized by a plurality of multicavity laser-diode chips each having a plurality of light-emission points.

6. A laser apparatus according to claim 1, wherein said plurality of laser diodes are realized by a plurality of single-cavity laser-diode chips each having a single light-emission point.

7. A laser apparatus according to claim 1, wherein each of said plurality of laser diodes contains a light emission region, and said metalization layer and said Au-Sn eutectic solder layer are separated by a groove which is arranged immediately below the light emission region.

8. A laser apparatus according to claim 1, wherein said plurality of submounts are made of AlN.

9. A laser apparatus according to claim 1, wherein said plurality of submounts are bonded to the heat-dissipation block with Au-Sn eutectic solder.

* * * * *